United States Patent
Ohmi et al.

[11] Patent Number: 6,107,007
[45] Date of Patent: *Aug. 22, 2000

[54] LITHOGRAPHY PROCESS

[75] Inventors: Tadahiro Ohmi, 1-17-301, Komegafukuro 2-chome, Aoba-ku, Sendai-shi, Miyagi-ken; Hisayuki Shimada; Shigeki Shimomura, both of Sendai; Akiyoshi Suzuki, Tokyo; Mamoru Miyawaki, Isehara; Miyoko Noguchi, Tokyo, all of Japan

[73] Assignees: Canon Kabushiki Kaisha; Tadahiro Ohmi, both of Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/015,437

[22] Filed: Feb. 9, 1993

[30] Foreign Application Priority Data

| Feb. 10, 1992 | [JP] | Japan | 4-057526 |
| Aug. 7, 1992 | [JP] | Japan | 4-233081 |
| Aug. 7, 1992 | [JP] | Japan | 4-233083 |

[51] Int. Cl.$^7$ ........................... G03C 5/00
[52] U.S. Cl. ............ 430/325; 430/326; 430/331
[58] Field of Search ................. 430/331, 325, 430/326

[56] References Cited

U.S. PATENT DOCUMENTS

| 4,395,480 | 7/1983 | Sprintschnik | 430/309 |
| 4,914,006 | 4/1990 | Kato et al. | 430/431 |
| 5,030,550 | 7/1991 | Kawabe et al. | 430/326 |
| 5,055,374 | 10/1991 | Seio et al. | 430/326 |

FOREIGN PATENT DOCUMENTS

| 0056138 | 12/1981 | European Pat. Off. |
| 0259985 | 3/1988 | European Pat. Off. |
| 0274044 | 7/1988 | European Pat. Off. |
| 0346844 | 12/1989 | European Pat. Off. |
| 0500393 | 8/1992 | European Pat. Off. |
| 1-129250 | 5/1989 | Japan |
| 1129250 | 5/1989 | Japan |

OTHER PUBLICATIONS

"Some observations of the effects of partial coherence on projection system imagery" by G. C. Dente et al.; Optical Engineering;Nov. Dec., 1983; vol. 22, No. 6. pp. 720–724.

*Primary Examiner*—Laura S. Werner
*Attorney, Agent, or Firm*—Fitzpatrick, Cella, Harper & Scinto

[57] ABSTRACT

A lithography process for forming a pattern having different sizes or different shapes of pattern components, comprises steps of exposing a resist to a predetermined light pattern by modified illumination, and removing, at least one step of forming the resist pattern, a region of the resist by employing a lithography-developing solution containing a surfactant, the surfactant being capable of promoting dissolution of a smaller pattern component to be removed of the resist.

The surfactant is represented by the general formula below:

$$HO(CH_2CH_2O)_a(CH(CH_3)CH_2O)_b(CH_2CH_2O)_cH$$

where a, b, and c are respectively an integer.

The surfactant satisfies the relation:

$$(A+C)/(A+B+C) \leq 0.3$$

where A represents the molecular weight of $HO(CH_2CH_2O)_a$, B represents the molecular weight of $(CH(CH_3)CH_2O)_b$, and C represents the molecular weight of $(CH_2CH_2O)_cH$.

7 Claims, 36 Drawing Sheets

FIG. 1
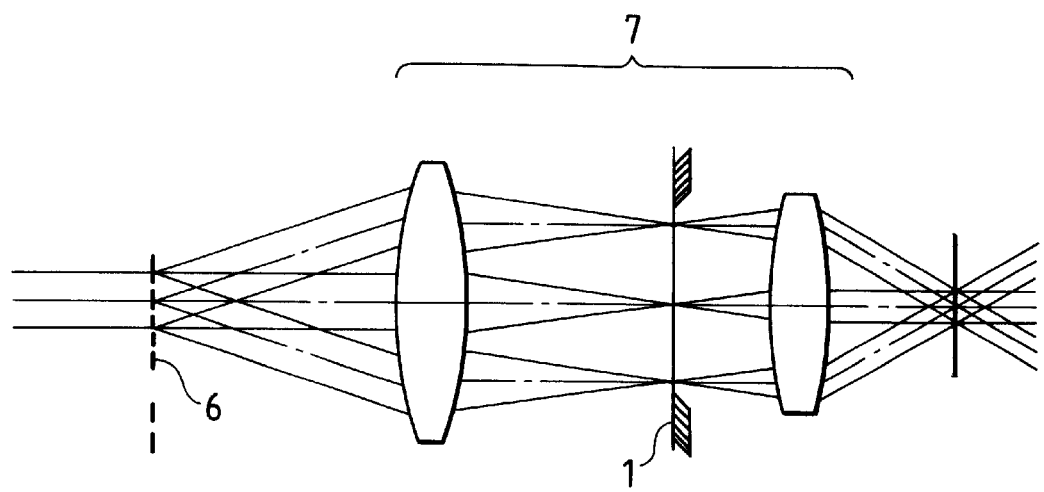
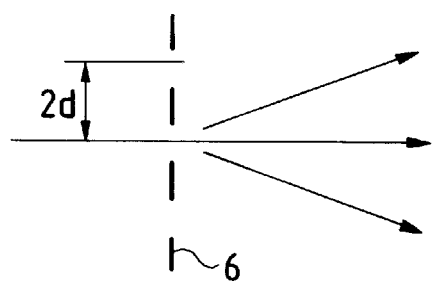

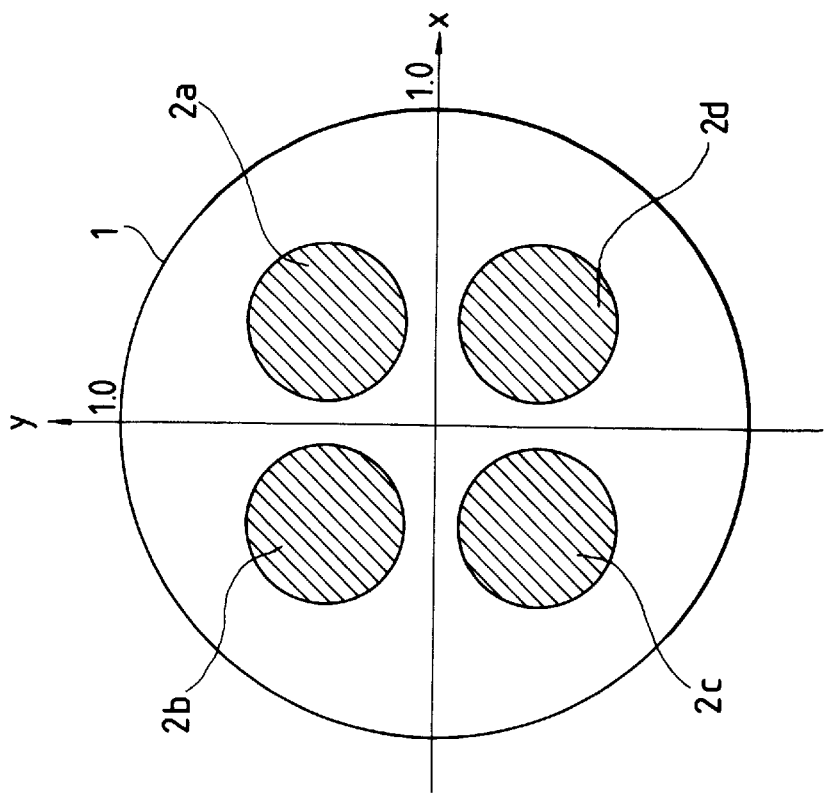
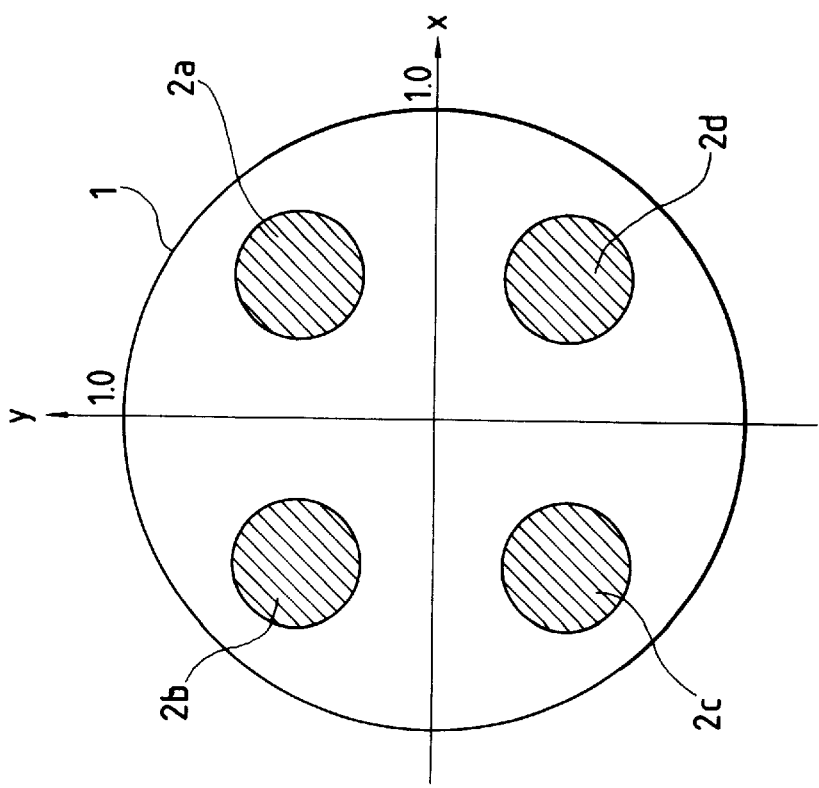

MASK 601

TEST PATTERN 602

0.5μm      0.3μm           0.35μm           0.4μm

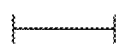
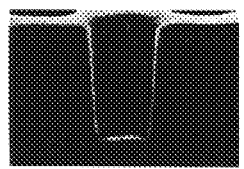
FIG. 10A
0.2μm
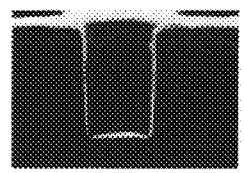
FIG. 10B
0.25μm
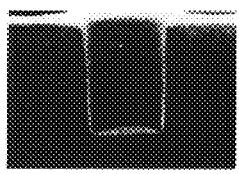
FIG. 10C
0.3μm

IN THE ABSENCE OF $O_3$

IN THE EXISTENCE OF $O_3$

|—0.75μm—|

FIG. 22A
FIG. 22B
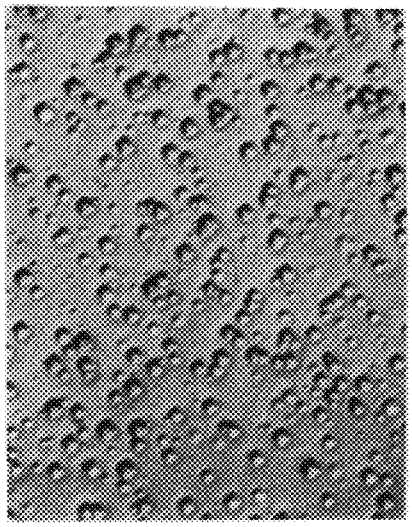
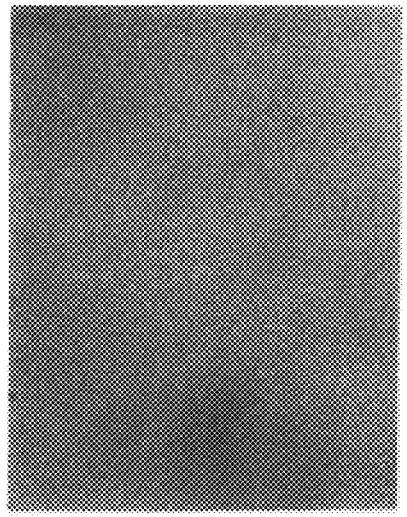
20 μm
23 °C

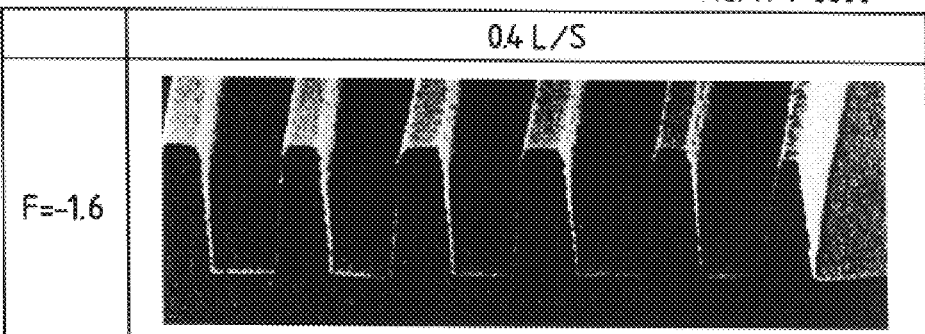
FIG. 24A1  F=-1.6
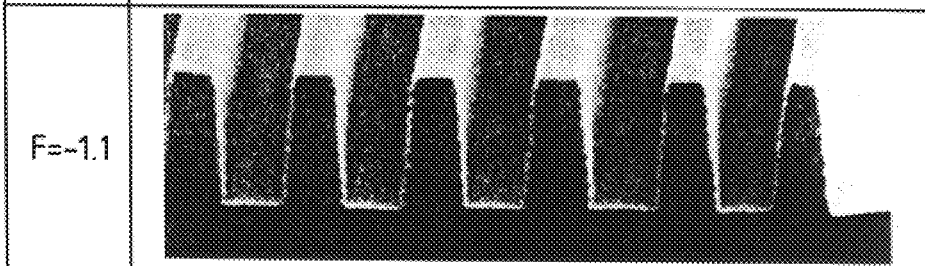
FIG. 24A2  F=-1.1
FIG. 24A3  F=-0.6
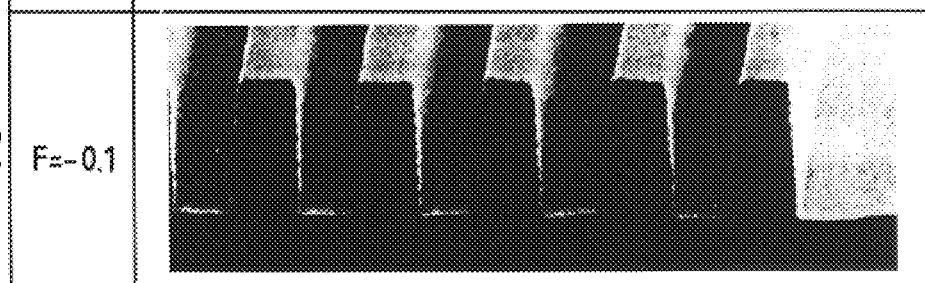
FIG. 24A4  F=-0.1
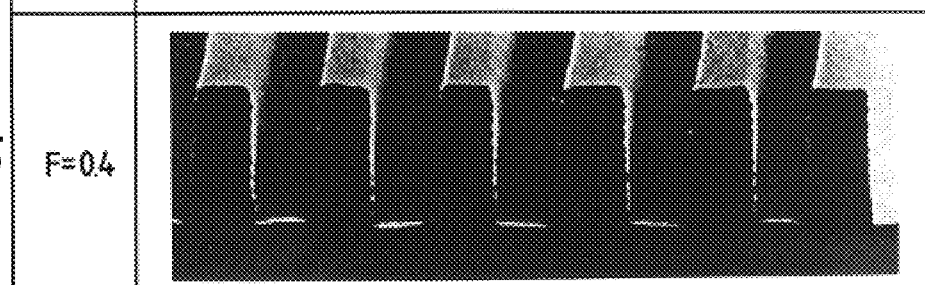
FIG. 24A5  F=0.4

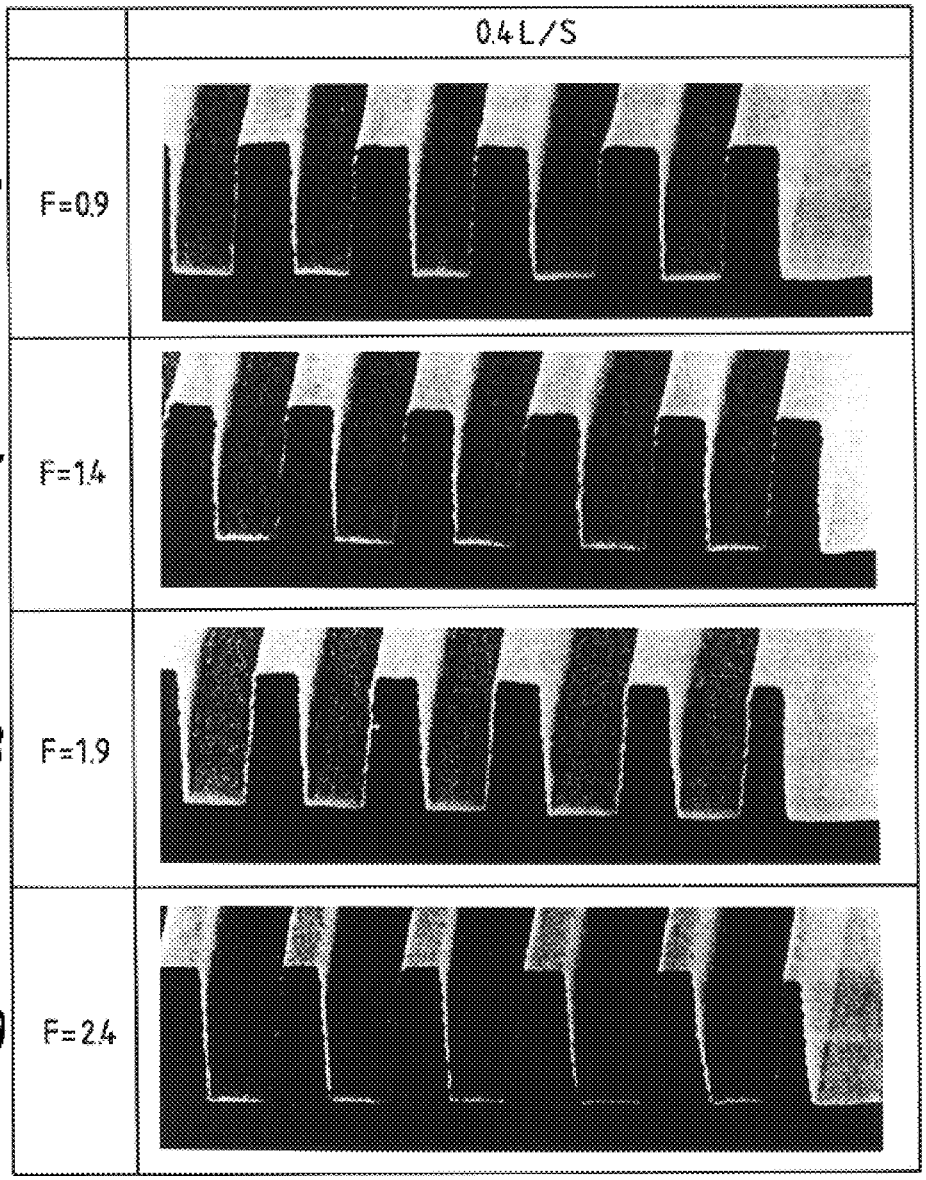

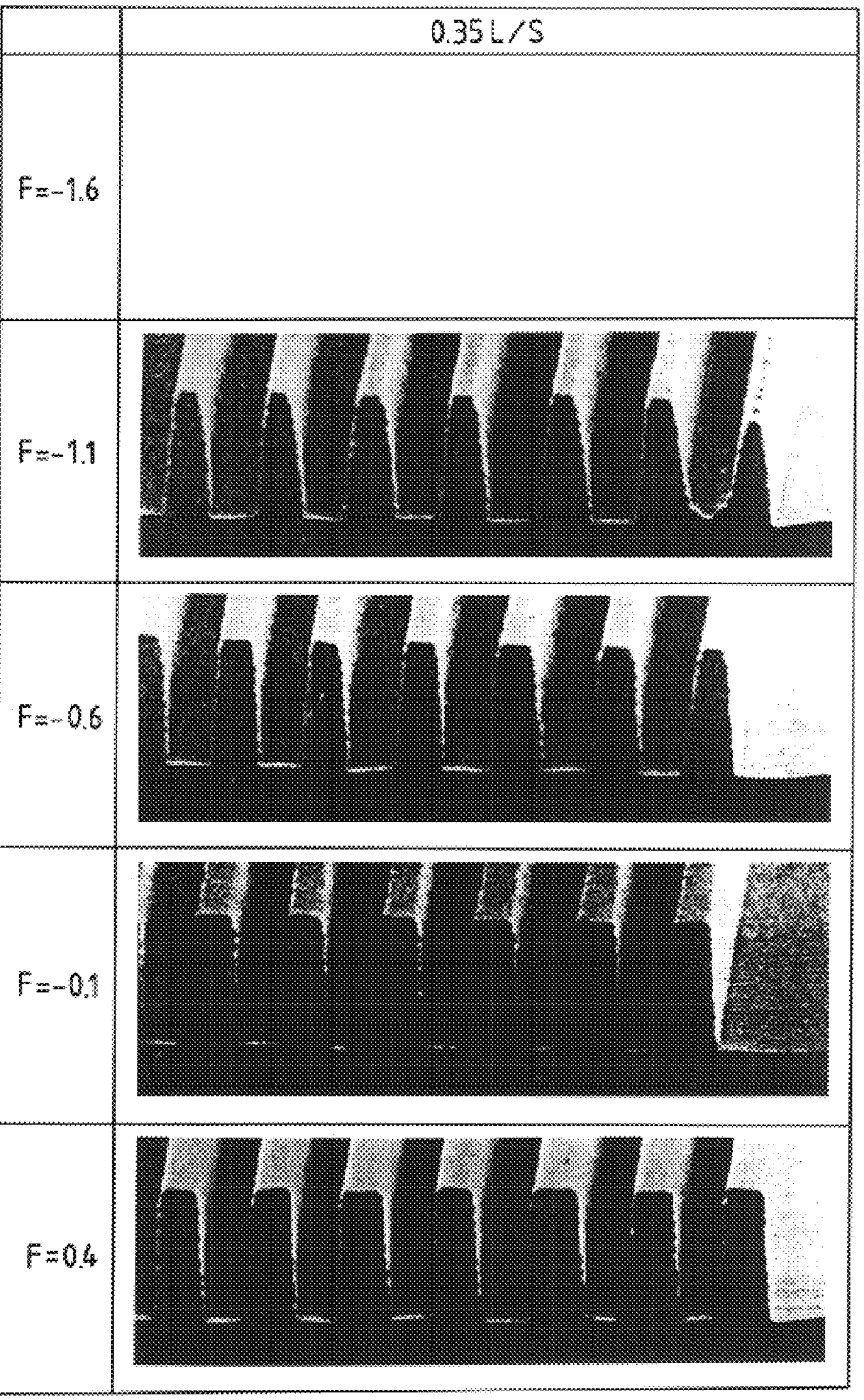

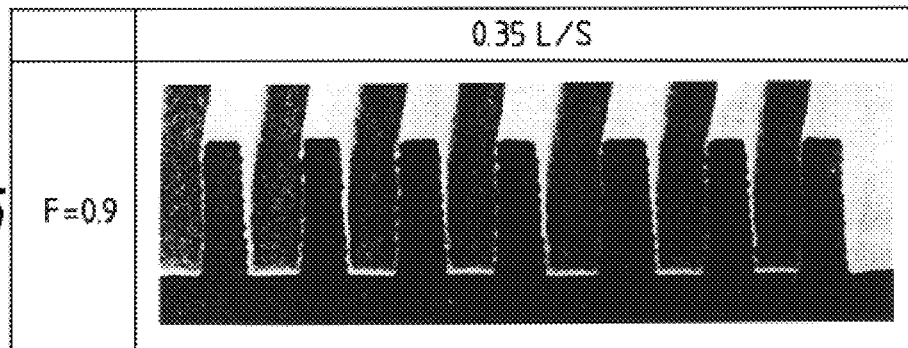
FIG. 24A15  F=0.9
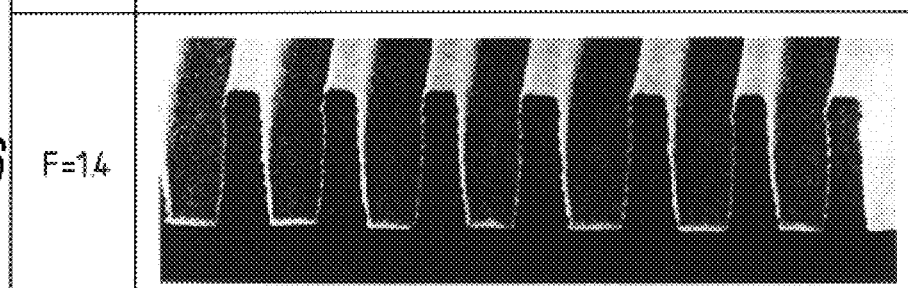
FIG. 24A16  F=1.4
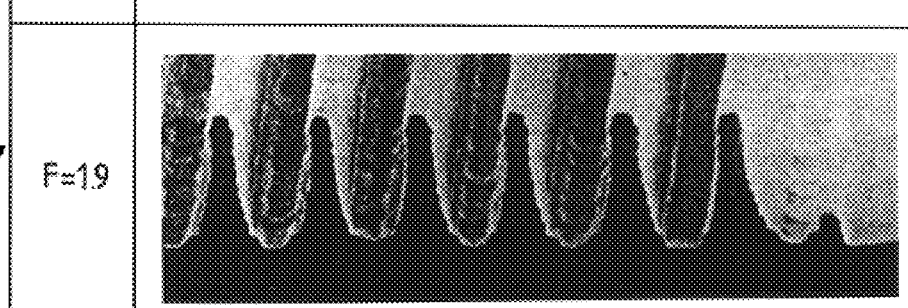
FIG. 24A17  F=1.9
FIG. 24A18  F=2.4

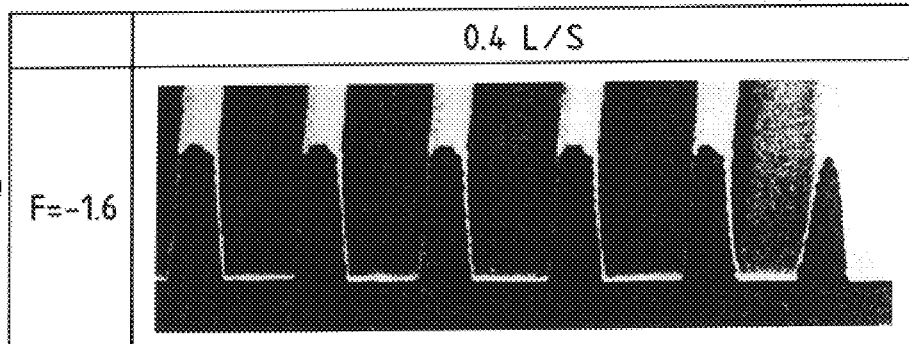
FIG. 24B1 F=-1.6
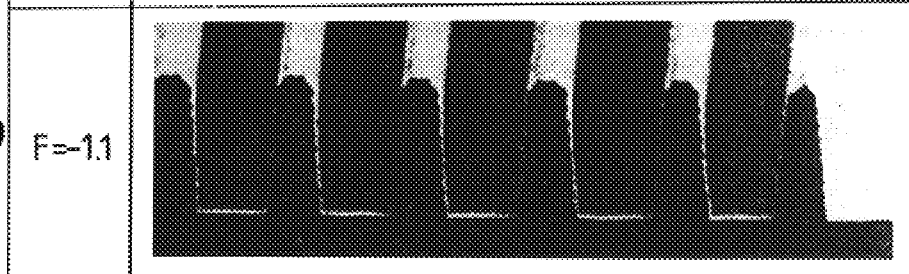
FIG. 24B2 F=-1.1
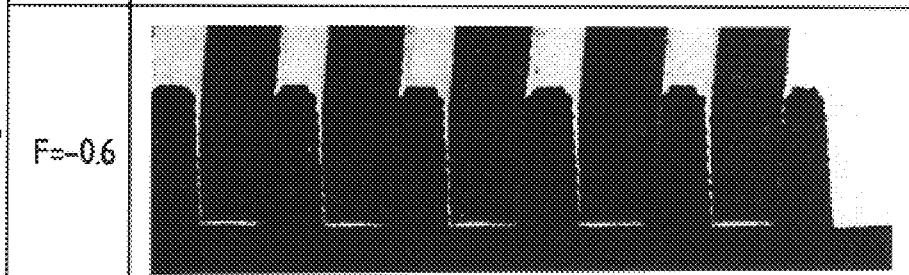
FIG. 24B3 F=-0.6
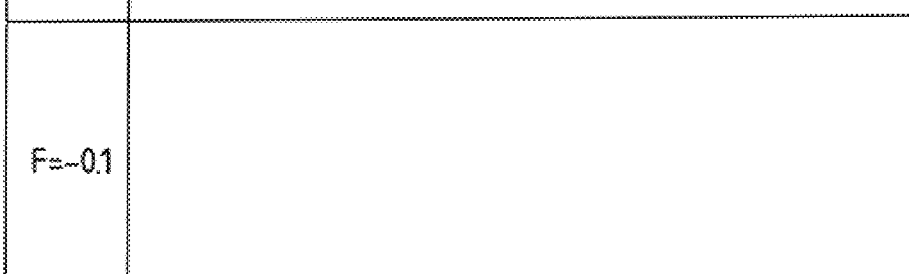
FIG. 24B4 F=-0.1
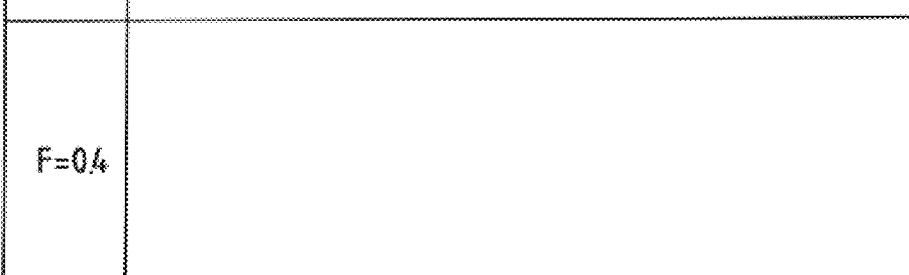
FIG. 24B5 F=0.4

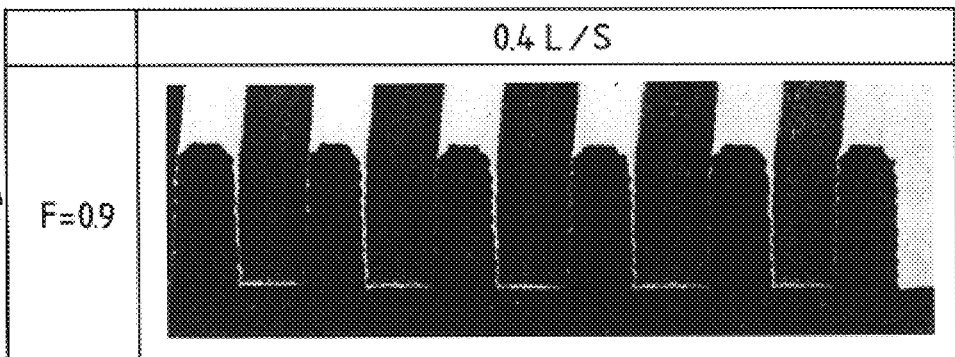
FIG. 24B6  F=0.9
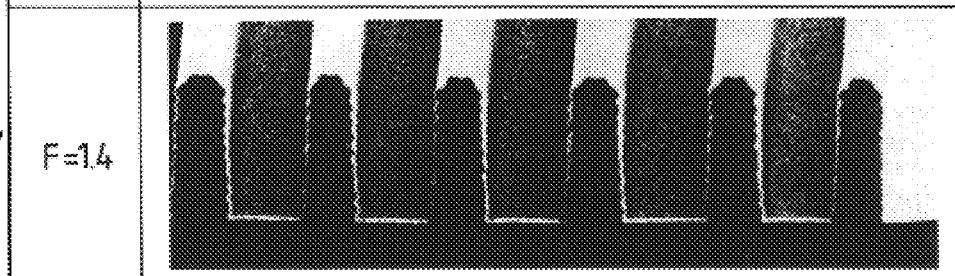
FIG. 24B7  F=1.4
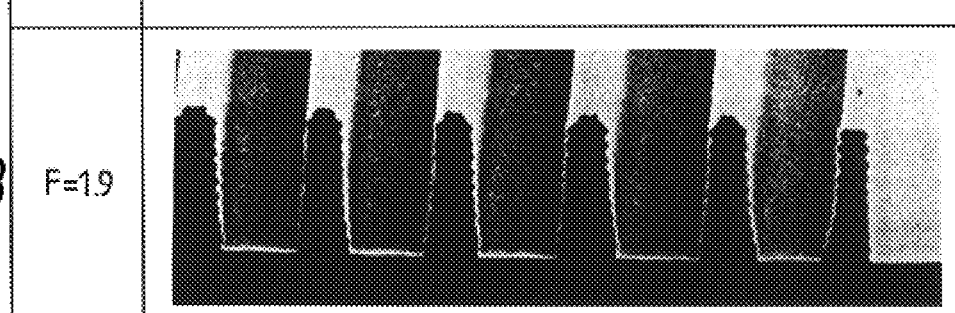
FIG. 24B8  F=1.9
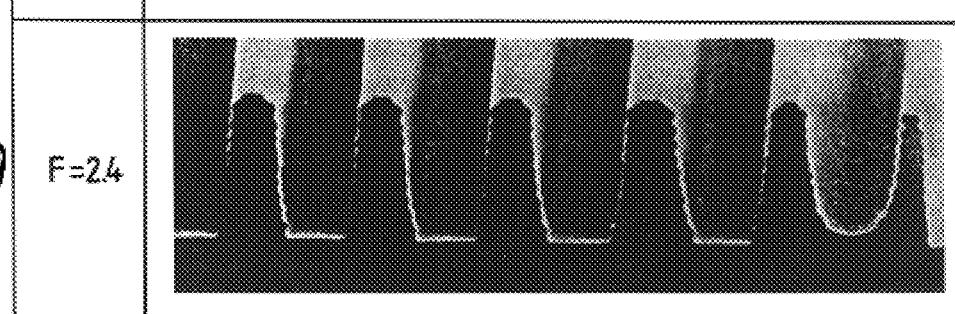
FIG. 24B9  F=2.4

| | 0.35 L/S |
|---|---|
| FIG. 24B10  F=-1.6 | |
| FIG. 24B11  F=-1.1 | 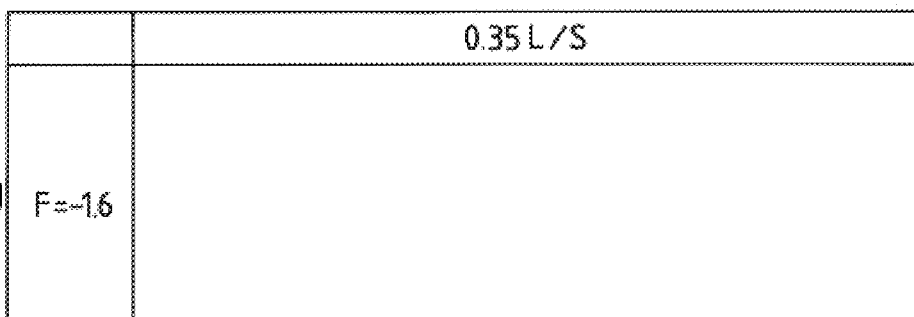 |
| FIG. 24B12  F=-0.6 | 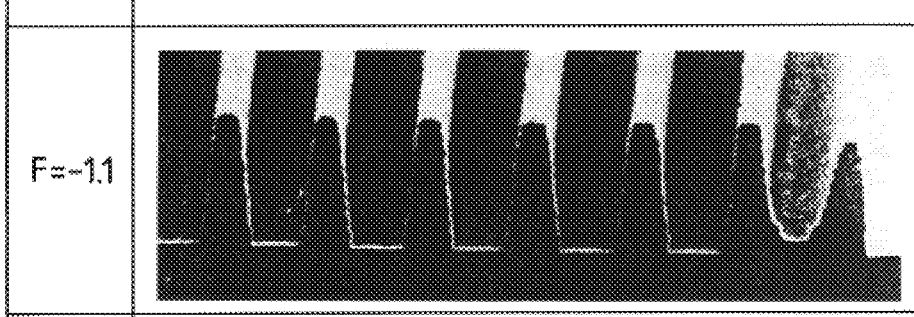 |
| FIG. 24B13  F=-0.1 | |
| FIG. 24B14  F=0.4 | |

1μm

FIG. 31A     FIG. 31A1     FIG. 31A2
220mJ/cm²
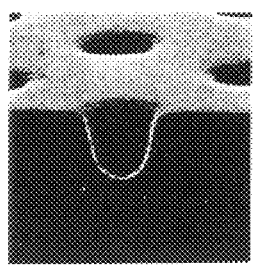 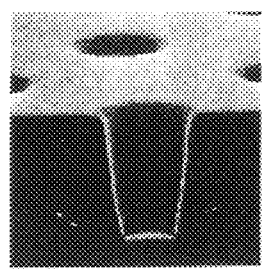 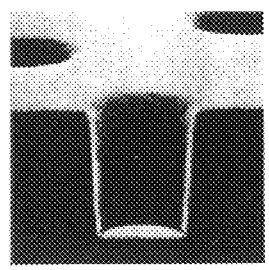
280mJ/cm²
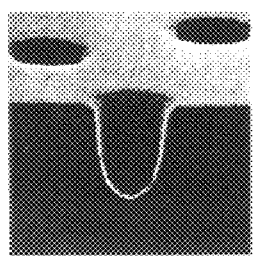 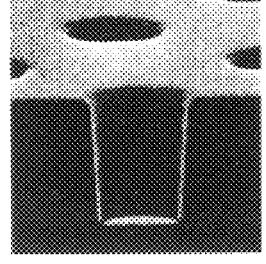 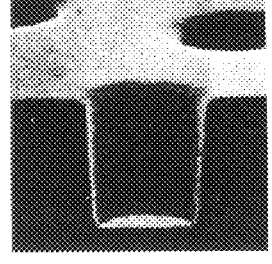
|—————|
1.0μm     0.6μm     0.7μm     0.8μm
FIG. 31B     FIG. 31B1     FIG. 31B2

FIG. 33A
FIG. 33B
FIG. 33C
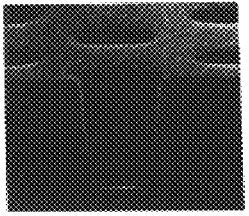
1.0μm    0.6μm
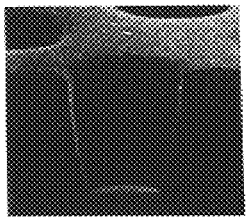
0.7μm
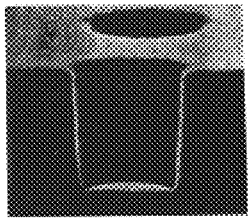
0.8μm

LITHOGRAPHY PROCESS

BACKGROUND OF THE INVENTION

1. Field of the Invention

The present invention relates to a lithography process, particularly to a lithography process which is suitable for producing an high density integrated circuit.

2. Related Background Art

Semiconductor elements are becoming more and more highly integrated: LSI's of 0.2–0.3 μm are now being investigated. Accordingly, it has been required in lithography to form fine resist patterns having a processing latitude. Hence, photoresists having a high resolution are used to form the patterns. Such resists are of a positive type or a negative type. In usual instances, the patterns are formed using an alkaline developer as exemplified by a 2.38% by weight aqueous solution of tetramethylammonium hydroxide (hereinafter "TMAH").

As resist materials have been made to have a higher resolving power, the ratio of dissolving rate at exposed areas of a resist layer to that at unexposed areas thereof, i.e., the selection ratio of a resist to a developer has been improved. The state thereof is shown in FIG. 26. In FIG. 26, the ratios of dissolving rate at exposed areas of a resist layer to that at unexposed areas thereof are shown as functions of TMAH concentration. In the drawing, a positive photoresist A has a resolution of 1.2 μm, a positive photoresist B, 0.8 μm, and a positive photoresist C, 0.6 μm. As shown in the drawing, the selection ratio a resist has is seen to have exponential-functionally increases with an improvement in the resolution of the resist. In other words, an achievement of a resist having a high resolution is seen to be equal to an improvement in the selection ratio at exposed areas of a resist layer and unexposed areas thereof.

In order to improve developability, it is attempted to increase the concentration of a developer. Such an attempt, however, leads to a decrease in the selection ratio at exposed areas of a resist layer and unexposed areas thereof, resulting in a deterioration of the resolution performance of resists.

FIG. 27 shows a 0.55 μm line-and-space resist pattern developed by a developer of a conventional type in which no surfactant is added. Exposure was carried out using a g-line reduction aligner having a lens with a numerical aperture of 0.43. Because of a poor wettability of the developer on the resist surface, trailing and residues (shown by the encircled portions, 2401, in FIG. 27) of the resist pattern are seen to have occurred after development. In order to prevent such a phenomenon, a developer containing a surfactant has been used in some instances. When, however, some types of substrates are used, none of conventional developers containing a surfactant can prevent the resist residues from occurring. Conversely, the addition of some types of surfactants has caused a decrease in the sensitivity of resists or a decrease in exposure latitude.

FIG. 28 shows the flatness of the surface of a silicon wafer having been immersed for 60 seconds in the developer of a conventional type in which no surfactant is added, which flatness is indicated as the central-line average roughness (JIS B0601). As is seen therefrom, the wafer having been immersed in the developer has a very rough surface only because of its contact with the developer for a time as short as 60 seconds, compared with a reference wafer having not been immersed in the developer. Fabrication of semiconductor devices in such a state of surface brings about an extreme deterioration of electrical characteristics. FIG. 29 shows data obtained by examining a channel mobility of MOS transistors fabricated by the use of wafers having a rough surface. The channel mobility is seen to be extremely poor with respect to the reference value when the surface has roughed upon its contact with the developer.

The silicon surface can be prevented from roughing when a certain surfactant is added to the developer, but the surfactant is adsorbed onto the silicon. FIG. 30 shows data obtained by observing the carbon $1s$ peak by X-ray photo-electron spectroscopy (XPS). A peak 2701 that shows the presence of the surfactant was seen in the data from the silicon surface exposed for 60 seconds to the developer containing a surfactant. It was found that, when the developer containing a surfactant was used, the surfactant was adsorbed to the underlying substrate and was not removable by usual rinsing. Adsorption of the surfactant to the substrate surface caused a carbon contamination to bring about a lowering of film quality in the subsequent formation of various kinds of thin films. On the other hand, when a surfactant not adsorptive to the silicon surface was selected, the surface of silicon roughed.

Under existing circumstances, no resist can show its ability when contact holes are formed using a resist having a resolution up to 0.6 μm (capable of forming line-and-space patterns with a mask fidelity).

FIGS. 31A and 31B shows cross-sectional photographs of contact holes developed using a conventional developer. In the case of exposure conditions under which contact holes with a size of 0.8 μm are formed (220 mJ/cm$^2$), 0.7 μm and 0.6 μm holes are in a condition of under-exposure.

In the case of exposure conditions under which contact holes with a size of 0.7 μm are formed (280 mJ/cm$^2$), 0.8 μm holes are in a condition of over-exposure and 0.6 μm holes are in a condition of under-exposure. Namely, in regions having a smaller exposure area in themselves (e.g., hole regions), the developer had so poor a wettability that it did not penetrate into the pattern and hence no satisfactory resist performance was exhibited.

In order to improve the wettability of developers, developers containing a surfactant are used. FIG. 32 shows the relationship between the concentration of a surfactant added to a developer and the exposure threshold energy for the formation of contact holes. The contact hole exposure threshold energy is meant to be an exposure energy necessary for the bottom of a contact hole to reach the underlying substrate. The exposure threshold energy decreases with an increase in the concentration of the surfactant added to the developer, but the difference in exposure threshold energy between different hole sizes does not change from the state before the addition of the surfactant. Namely, when conventional surfactants are used, it has been impossible to form fine contact holes with different size, in a high precision under the same exposure conditions.

FIG. 33 shows cross-sectional photographs of contact holes formed using developers containing the surfactant as shown in FIG. 32. FIG. 33 shows that when the conventional surfactants are added the side walls of contact holes have a curved shape. When the amount of a conventional surfactant added was increased to improve the wettability of the developer, a deterioration of hole configuration occurred.

In addition to the above discussed high-precision development of resists, a method of exposure in high resolution is indispensable for forming an extremely fine pattern precisely as designed, and is now being investigated actively.

Methods conventionally employed for improving the resolution of the apparatus is to increase the NA of an optical system (demagnification projection lens system). However, the increase of NA gives rise to a problem of decrease of the focal depth because the focal depth is inversely proportional to the square of NA. Accordingly, in recent years, change of the exposure light length is attempted from the g-line to the i-line or excimer laser of 300 nm or shorter wavelength, which utilizes the effect that the focal depth and the resolution of an optical system are improved in inverse proportion to the wavelength.

A further method which has recently been developed for improving the resolution of the exposure is use of a phase shift mask. In this method, a thin film which causes a phase shift of 180° relative to other part is formed in a partial area of the light-transmissive portion of the mask. The resolution power (RP) is represented by the equation: $RP=k_1\lambda/NA$. In usual steppers, the value of the factor $k_1$ is from 0.7 to 0.8, while in the phase shift mask method, the $k_1$ factor can be theoretically as low as about 0.35. This phase shift mask still involves many problems in practical use: the problems as below:

1. The thin film forming technique for phase shift film has not been established yet.
2. The CAD for design of a circuit pattern with a phase shift film has not been established.
3. To a certain pattern, the phase shift film is not applicable.
4. The testing method and the conditioning technique have not been established for the phase shift film.

Therefore there are many obstacles in practical use of the phase shift mask, and a long time seems to be required to practicalize the phase shift mask.

Accordingly, in place of the phase shift mask involving many unsolved problems, a projection method for fine pattern image is required which has a resolving power equivalent to or higher than that of the phase shift mask method.

As discussed above, the lithography at the present stage is not capable of forming a pattern as designed when different sizes and different shapes of pattern components are mixedly exist in a pattern. In particular, a random pattern involving patterns of 0.2 µm or finer cannot readily be formed by the lithography.

In fine patterning at a practical use level, enlargement of the focus margin is important. Conventional methods are not capable of forming a patterning on a stepped portion since the focus margin is as small as 0.5 µm for a line-and-space of 0.4 µnm.

SUMMARY OF THE INVENTION

The present invention intends to provide a lithography process which is capable of forming extremely a fine resist pattern construction including different dimensions and different shapes of pattern components in precise accordance with design, especially capable of forming a random pattern construction having both a fine pattern component of about 0.2 µm or less and a fine pattern component of 0.15 µm or less.

The present invention also intends to provide a lithography process having a large focus margin.

The lithography process of the present invention for forming a pattern having different dimensions or different shapes of pattern components comprises steps of exposing a resist to a predetermined light pattern by modified illumination, and removing, at least one step of forming the resist pattern, a region of the resist by employing a lithography-developing solution containing a surfactant, the surfactant being capable of promoting dissolution of a smaller pattern component to be removed of the resist.

BRIEF DESCRIPTION OF THE DRAWINGS

FIG. 1 illustrates the principle of the projection of a demagnified pattern image.

FIGS. 3A and 3B illustrate respectively an example of an effective light source on a pupil.

FIG. 22A and FIG. 22B are photographs showing the surface roughness by use of a conventional developing solution (FIG. 22A) and the developing solution of Example 9 (FIG. 22B).

FIG. 24A1 to FIG. 24B3 show the electron micrographs of line-and-space resist pattern formed with the developing solution of Example 10 on exposure at various focus positions by use of resist MCPRi6600 (FIGS. 24A1 to 24A4) and resist THMRip1800 (FIGS. 24B1 to 24B3).

FIGS. 31A and 31B show photographs showing hole pattern profiles formed by a conventional developing solution.

FIG. 33 shows photographs of hole patterns formed with a developing solution containing a surfactant used in FIG. 32.

DETAILED DESCRIPTION OF THE PREFERRED EMBODIMENTS

In the present application, a developer containing a surfactant capable of increasing the dissolution of a resist in a smaller resist pattern is used. Hence, when a resist pattern formed by projecting using a patterning apparatus a pattern having regions with different size is developed using this developer, the surfactant is adsorbed to the resist surface. Then, because of the presence of the surfactant in fine regions into which liquid usually does not readily penetrate, the development proceeds through the same process as in regist regions having a relatively large area in the pattern. Hence, without regard to the size and shape of resist regions, a fine resist pattern having regions with different sizes and shapes can be developed as originally designed, so that it becomes possible to provide LSIs with much ultra-higher density and much ultra-higher speed.

In the lithography process of the present invention, the surfactant has preferably an antifoaming property. There are three preferred embodiments of the surfactant as follows.

The surfactant may preferably be, for example, in a first embodiment an amine type surfactant having an ethylene-propylene block in a molecular chain, and in a second embodiment a surfactant having an amine group, an ethylene oxide group and/or a propylene oxide group as hydrophilic groups. The concentration of the surfactant may preferably be 300 ppm or more.

The surfactant used in the present invention may particularly preferably be a surfactant of the formula.

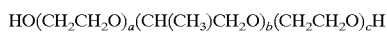

$$HO(CH_2CH_2O)_a(CH(CH_3)CH_2O)_b(CH_2CH_2O)_cH \qquad (I)$$

wherein a, b and c are each an integer.

A surfactant satisfying the following expression is more preferred:

$$(A+C)/(A+B+C) \leq 0.3$$

where A is a formula weight of a moiety $HO(CH_2CH_2O)_a$, B is a formula weight of a moiety $(CH(CH_3)CH_2O)_b$, and C is a formula weight of a moiety $(CH_2CH_2O)_cH$ in the Formula (I), respectively. The molecular weight of the surfactant may preferably be not more than 4,000. The surfactant in the developer may preferably be in a concentration of from 100 ppm to 1,000 ppm.

As the surfactant used in the present invention, the surfactant represented by Formula (I) is preferred. Making optimum the structure and molecular weight of the surfactant enables better prevention of the foaming that may occur during development, and also enables better prevention of film loss at unexposed areas, so that a fine pattern can be formed in a very high precision.

Figure 23:
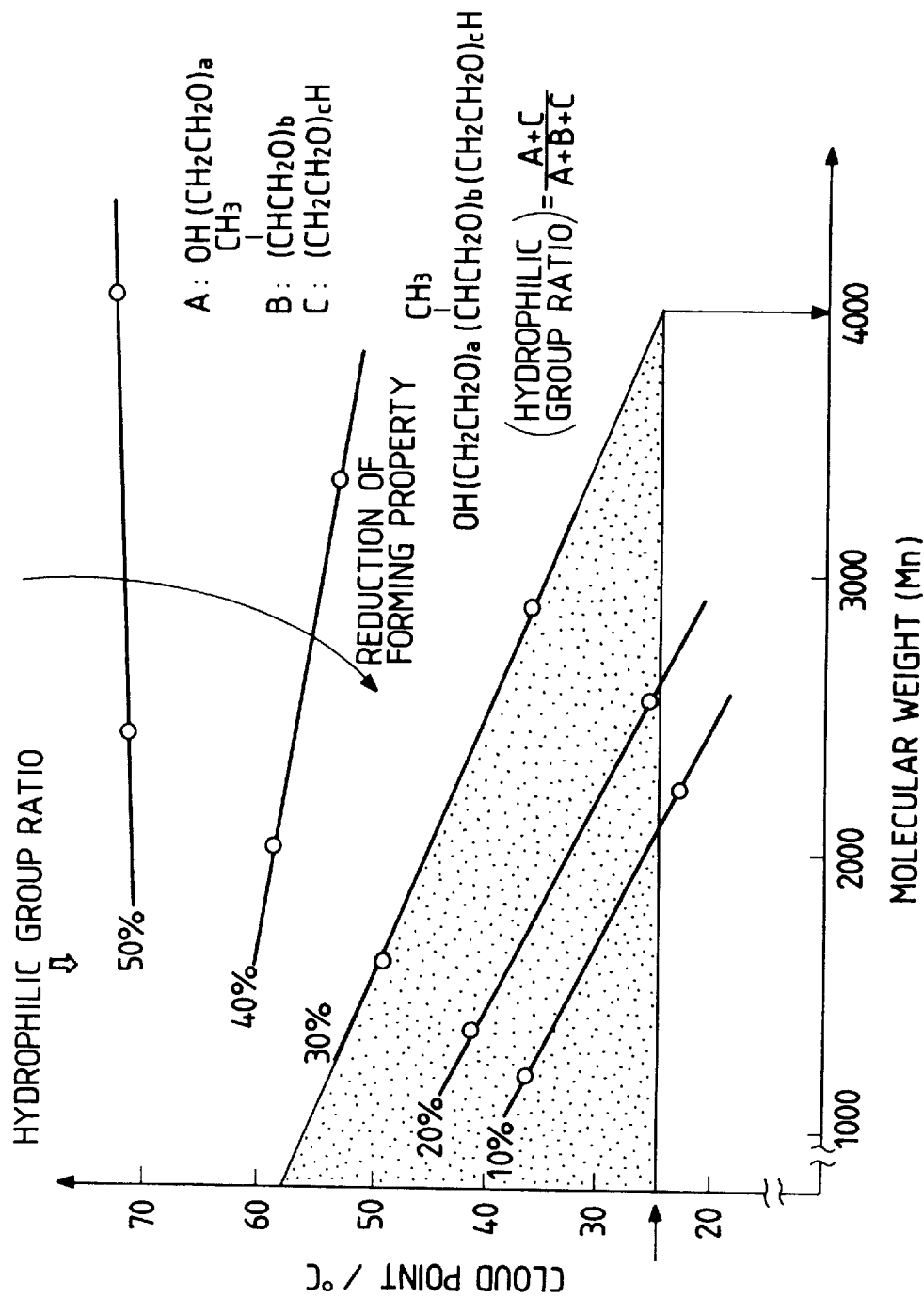
FIG. 23 is a graph showing the dependency of the foaming property and the cloud point on the molecular weight and the hydrophilic group ratio of the surfactant of the present invention.

FIG. 23 shows the relationship between molecular weight of the surfactant, a proportion of hydrophilic groups [(A+B)/(A+B+C)], foaming properties, and a cloud point. As is clear from FIG. 23, the foaming properties decrease as the proportion of hydrophilic groups is made smaller. No foaming comes to occur at all at 30%, and there is no faulty pattern due to foaming. The cloud point can be 25° C. or above when the surfactant has a molecular weight of not more than 4,000. There is no influence of deposition of the surfactant under usual developing conditions, and a pattern can be formed in a high precision.

Further, the use of the surfactant in an amount of more than 100 ppm improves more the wetting property of the developing solution, and facilitates the formation of a random pattern having various dimensions of pattern components mixedly. The upper limit of the addition of the surfactant is 1000 ppm owing to the solubility of the surfactant.

The surfactant adsorbed on the resist surface or the substrate underlying the resist may preferably be removed using ultra pure water containing not less than 0.1 ppm of ozone. In such a case, the ozone in the ultra pure water may preferably be in a concentration of not less than 2.0 ppm.

The aforementioned modified illumination is a method which illuminates a fine pattern constituted by vertically and laterally arranged pattern components and projects the fine pattern by introducing the light diffracted by the fine pattern into the pupil of the projection optical system, and is characterized by formation of an effective light source giving light quantity distribution such that the light intensity is higher on portions except the pupil center and a pair of axes passing the center of the pupil and extending the vertical and lateral directions of the pattern.

The present invention can be remarkably effective especially when the resist pattern has a resist region size of 0.5 μm or less.

The method of light exposure employing modified illumination is described in detail by reference to the drawings. The modified illumination includes annular band illumination and Q.U.E.S.T. (quadrupole effect for stepper technology). The annular band illumination employs a doughnut-shaped light source to give large angles for zero-order and first-order exposure light diffracted by the mask to increase the apparent NA to improve the resolution. The Q.U.E.S.T. gives higher resolving power than the annular band illumination.

FIG. 1 illustrates the projection of an image of a fine pattern 6 of high frequency wave number (pitch 2d of several μm) through a projection lens system 7. The fine pattern 6 illuminated from the direction vertical to the surface diffracts the incident light flux. The resulting diffracted light includes zero-order diffracted light which is directed to the same direction as the incident light, and high-order diffracted light of ±1 order or higher order which is directed to the other direction. Of the diffracted light, limited order number of light, e.g., light of zero order and ±1 order is introduced to the pupil 1 of the projection lens system 7 and is directed through the pupil 1 to the image plane of the projection lens system to form an image of the fine pattern 6 on the image plane. In such image formation, the light component of higher order diffracted light contributes the contrast of the image. Therefore, with the increase of the frequency of the fine pattern, the higher order diffracted light comes not to be caught by the optical system. Thereby the contrast of the image is lowered, and in an extreme case, image cannot be formed.

Figure 2A:
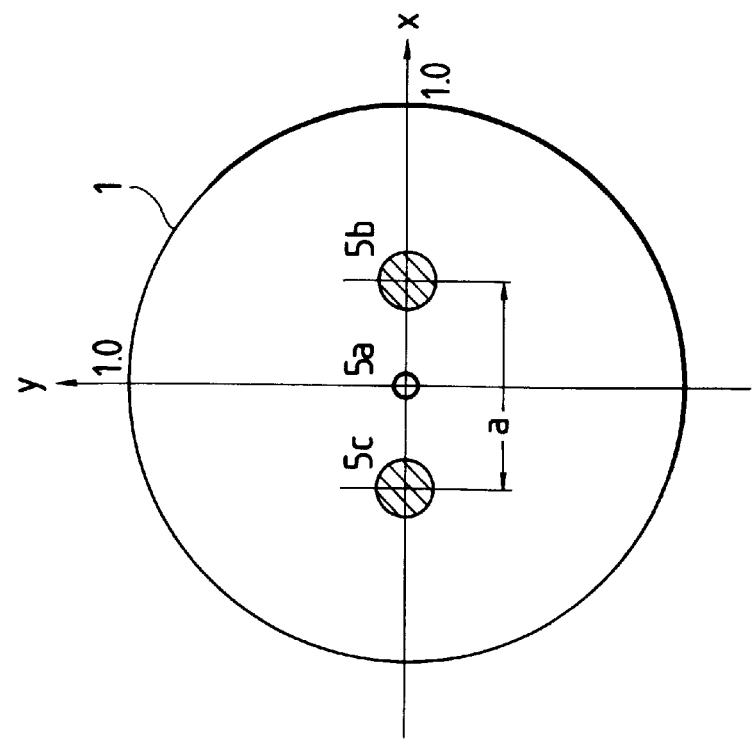
FIG. 2A and FIG. 2B illustrate schematically distribution of light on a pupil when a conventional mask is used (FIG. 2A), and when a phase shift mask is used (FIG. 2B).
Figure 2B:
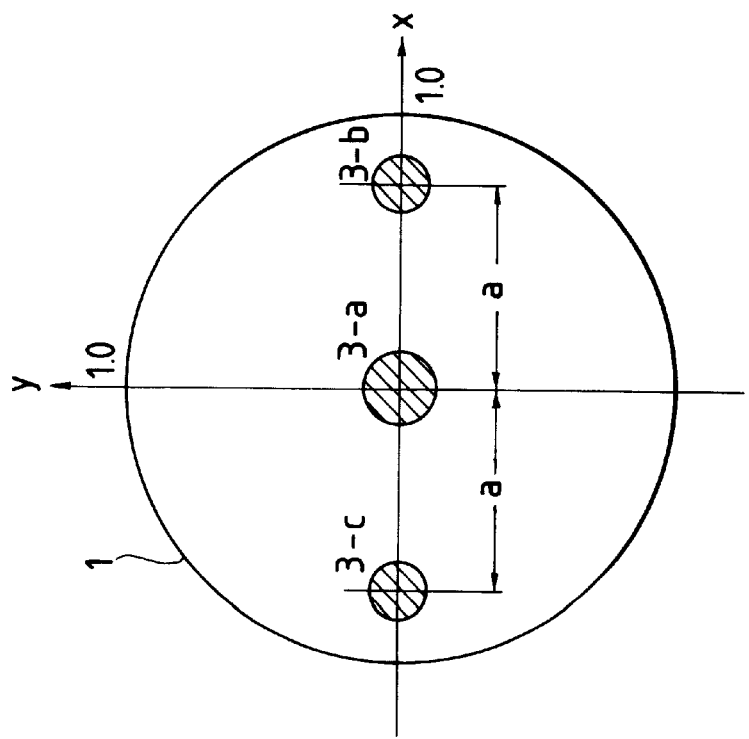

FIG. 2A shows the light distribution in the pupil 1 when the fine pattern 6 of FIG. 1 is formed on a conventional type mask, and FIG. 2B shows the light distribution in the pupil 1 when the fine pattern 6 of FIG. 1 is formed on a phase shift mask.

In FIG. 2A, +1 order diffracted light 3b and −1 order diffracted light 3c are formed around the zero-order diffracted light 3a, while, in FIG. 2B, the zero-order diffracted light 5a disappears and ±1 order diffracted light 5b and 5c only is formed owing to the effect of a phase shift film. From the comparison of FIG. 2A with FIG. 2B, the effects of the phase shift mask in the spatial frequency plane, namely a pupil plane, are exhibited in the two points below.

1. In the phase shift mask, the frequency is reduced to ½.
2. In the phase shift mask, zero-order diffracted light does not exist.

Another remarkable point is that the interval "a" between the ±1 order diffracted light on the pupil plane in the phase shift mask is equal to the interval "a" between the zero-order light and the respective ±1 order diffracted light on the pupil plane of the conventional mask.

On the other hand, the light distributions on the pupils 1 of the conventional mask and the phase shift mask coincide positionally. The difference between the two masks is intensity ratio in amplitude distribution on the pupil 1. With the phase shift mask of FIG. 2B, the amplitude ratio of diffracted light of zero-order, ±1 order and −1 order is 0:1:1, while in the conventional type mask of FIG. 2A, the ratio is $1:(2/\pi):(2/\pi)$.

The process of the present invention does not use any phase shift mask, but causes light distribution similar to that caused by the phase shift mask. For this purpose, the process employs an effective light source giving light quantity distribution that the light intensity is higher on the areas except the center of the pupil and a pair of axes passing the center of the pupil and extending the vertical and lateral directions of the pattern, preferably the light distribution is approximately zero in the area of the pupil center and of a pair of axes passing through the center of the pupil and extending the crossing direction of the pattern. Thereby, on illuminating the fine pattern 6, especially a fine pattern having a spatial frequency of the $k_1$ factor of 0.5 as mentioned in the description "Related Prior Art", zero order and other high order diffracted light is introduced to the position other than the center of the pupil 1.

By using such an effective light source, out of the diffracted light generated on illumination of a fine pattern of $k_1$ factor of about 0.5, the zero-order diffracted light and one of the +1 order diffracted light and the −1 order diffracted light are introduced to the pupil 1, and the other one of the ±1 order light is not introduced to the pupil 1, whereby the light distribution on the pupil 1 is made similar to that caused by the phase shift mask. Therefore, the same effect can be obtained readily as in the case where a phase shift mask is used, merely by changing the illumination method and the illumination system for the fine pattern.

In the present invention, on illumination with a single light flux, the amplitude ratio of the one pair of diffracted light at the pupil 1 is $1:(2/\pi)$, which differs from the more preferable amplitude ratio of 1:1 for the phase shift mask. This difference is found to be compensated, for example, by illuminating obliquely the mask (fine pattern) with a pair of light fluxes to form a pair of light pattern symmetrical regarding the vertical axis of the pupil (the axis extending in the vertical direction through the center of the pupil) in the case where the vertical pattern of the mask is resolved; and by illuminating obliquely the mask (fine pattern) with a pair of light fluxes to form a pair of light pattern symmetrical regarding the lateral axis of the pupil (axis extending in the lateral direction through the center of the pupil, and perpendicular to the aforementioned vertical axis) in the case where the lateral pattern of the mask is resolved. The illumination therefor is conducted, for example, with two illumination light fluxes such that the light quantity distribution of the effective light source on the pupil has one pair of peaks having approximately equal intensity in the areas along the first axis passing through the center of the pupil and extending in a direction at an angle of about 45° to the xy axes and symmetric regarding to the pupil center. Otherwise, illumination is conducted, e.g., with four light fluxes such that the light quantity distribution of the effective light source on the pupil has one pair of regions having approximately equal intensity in the areas along the first axis passing through the center of the pupil and extending in a direction at an angle of about 45° to the xy axes and symmetric regarding to the pupil center, and has another one pair of regions approximately equal intensity in the areas along the second axis passing through the center of the pupil and extending in a direction at an angle of about 90° to the aforementioned first axis and symmetric regarding to the pupil center and being at nearly the same position relative to the pupil center.

FIG. 3A and FIG. 3B show, as one example of the process of the present invention, the light distribution of the zero-order diffracted light, namely, the distribution of effective light sources, on the pupil 1 of FIG. 1. In FIG. 3A and FIG. 3B, the numeral 1 denotes a pupil: x, a lateral axis of the pupil (an axis passing the center of the pupil and extending in a direction of a lateral pattern); y, a vertical axis of the pupil (an axis passing the center of the pupil and extending in a direction of a vertical direction and perpendicular to the above lateral axis of the pupil); and 2a, 2b, 2c, and 2d respectively denotes the portions of the effective light source.

In these two examples, the effective light source has distribution constituted of four portions. The respective portions (light patterns) are circular. If the radius of the pupil 1 is taken to be 1.0, the origin of the coordinate is at the center of the pupil, and the xy axes are orthogonal coordinate axes, then in the example of FIG. 3A, the centers of the portions of 2a, 2b, 2c, and 2d are respectively at the positions (0.45, 0.45), (−0.45, 0.45), (−0.45, −0.45), and (0.45, −0.45), and the respective portion has a radius of 0.2. In the example of FIG. 3B, the centers of the portions of 2a, 2b, 2c, and 2d are respectively at the positions (0.34, 0.34), (−0.34, 0.34), (−0.34, −0.34), and (0.34, −0.34), and the respective portion has a radius of 0.25.

The respective portions 2a, 2b, 2c and 2d of the effective light source in this example are formed in the four quadrants divided by the xy axes on the pupil plane, and are positioned symmetrically to each other independently without overlapping. The directions of the x axis and the y axis to divide the quadrants are made to coincide with the x axis and the y axis, for example, of integrated circuit design, and extend in the directions of vertical and lateral patterns of the mask.

The shape of the effective light source in this example is decided in consideration of the directions of the vertical and lateral fine pattern of the image to be projected. The centers of the four circular portions 2a, 2b, 2c, and 2d are positioned in the directions of ±45°, namely on a pair of axes extending through the center of the pupil 1 at angles of ±45° to the x axis and the y axis. Such an effective light source is formed by introducing four illumination light fluxes obliquely onto the fine pattern at the same incident angle along orthogonal introducing planes for each pair of the light fluxes.

It is important that the intensities of the four portions of the effective light source are equal to each other. If the intensities are not equal, for example, the circuit pattern image is deformed when the wafer for printing is defocused. Therefore the intensities of the four illumination fluxes are set to be equal. The intensity distribution within each of the four portions 2a, 2b, 2c, and 2d may be appropriately decided: uniform distribution of a peak value over the entire portion, or nonuniform distribution having a peak value only at the center. Therefore, the four light fluxes may be in various shape in correspondence with the shape of the effective light source to be formed on the pupil 1. In this example, the four portions of the effective light source are separated from each other and no light pattern is formed outside the portions. Otherwise, the four portion of the effective light source may be joined with interposition of relatively weak light patterns.

The shape of distribution of the four portions 2a, 2b, 2c, and 2d of the effective light source is not limited to be circular. However, the centers of the four portions are preferably in the directions of ±45° to the xy axes and at symmetric positions as shown in FIG. 3A and FIG. 3B.

In an optimum arrangement of the effective light source for a system of a smaller $k_1$ value to obtain higher resolution, the gravitational position of the respective portions 2a, 2b, 2c, and 2d of the effective light source in each quadrant come apart from the center of the pupil and the diameter of the respective independent parts 2a, 2b, 2c, and 2d become smaller as understood by comparison of FIG. 3B with FIG. 3A.

In FIG. 3A and FIG. 3B, two assumed shapes of the effective light source are shown. In practical design, an effective light source of the shape approximate to the above two assumed shape would be employed. It is because, if the gravitational points of the parts of the effective light source are arranged at positions excessively distant from the pupil 1 disadvantages such as insufficient light quantity may be caused.

In consideration of the above matters, in FIGS. 3A and 3B, it was found to be preferable that the radius "q" of the pair of the separate parts 2a and 2c in the first and the third quadrants, and the center position (gravitational center position) of the parts 2a and 2c of (p,p) and (−p,−p) satisfy the conditions below:

0.25<p<0.6

0.15<q<0.3

The size and the position of the other portions 2b and 2d in the second and the fourth quadrants are decided naturally by the symmetry to the portions 2a and 2c in the first and the third quadrants. In the case where the shape of the portions of the effective light source is not circular, e.g., in a triangle shape or a quadrangle shape, the portions preferably are within the regions of the above conditions, where the radius of the circumcircle is taken as the value of q. The examples shown in FIGS. 3A and 3B have the values in the middle of the above conditions. The values of p and q depend on the line width of the fine pattern required to the optical system (illumination system/projection system) employed.

In conventional steppers, the intensity peak of the effective light source is placed at the center (x, y)=(0, 0) of the pupil 1. In such a system, the coherence factor σ of 0.3 or 0.5 means that the effective light source has a dense distribution within a circle of 0.3 of 0.5 having the center of the circle on the center of the pupil 1. The inventors of the present invention have found by analysis that the effective light source near the center of the pupil, for example with the σ value of 0.1 or less, is effective to maintain the contrast high at the line width of the $k_1$ factor of 1 or more on occurrence of defocusing, but the effect in defocusing falls rapidly with approach of the $k_1$ factor to 0.5 and, at the $k_1$ value of exceeding 0.5, the contrast of the image is completely lost in an extreme case. At the present technical level, improvement of the performance on defocussing is required at $k_1$ factor of not higher than 0.6. In this region of $k_1$ factor, the presence of the effective light source near the center of the pupil affect adversely the image formation.

On the contrary, the effective light source of the above examples has a smaller $k_1$ factor, and is effective in maintaining the contrast high on defocusing in image formation of $k_1$ factor of about 0.5. The example of FIG. 3A is superior to the example of FIG. 3B in high frequency characteristics since the portions 2a, 2b, 2c and 2d in the former are placed at more outside positions than those in the latter. The defocus characteristics of the effective light source at the part distant from the pupil center serves to maintain the focal depth at about the same level to the $k_1$ factor of about 1.

Figure 4:
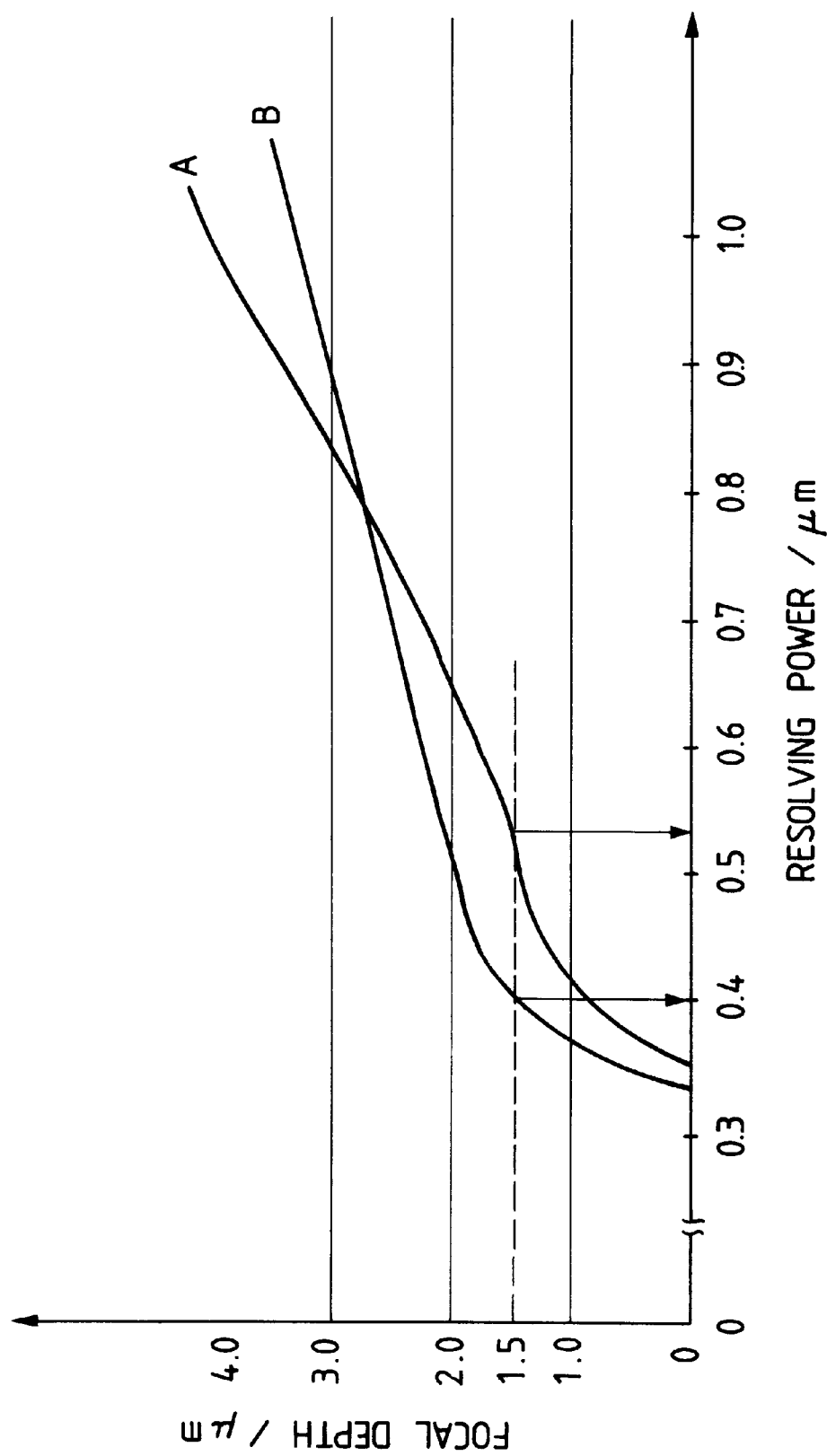
FIG. 4 is a graph showing the frequency characteristics of the projection systems for formation of the effective light source in FIG. 3A and of a conventional projection system.

FIG. 4 shows the results of calculation of the relations between the resolving power and the focal depth when the form of FIG. 3B is applied to an i-line reduction aligner having a projection lens system of NA 0.5, by assuming that defocus in the range of satisfying the optical image contrast 70% is regarded to be within the focal depth (allowable value). In the graph, the curve A shows the relation between the resolving power and the focal depth by a conventional method (σ=0.5) for an ordinary reticle, and the curve B shows the relation of the resolving power and the focal depth for the case of FIG. 3B. Assuming the allowable focal depth to be 1.5 μm, the resolving power in the conventional method is limited to 0.52 μm, while in the case of FIG. 3B, the resolving power is improved to about 0.4, which means the improvement of about 30% in ratio, and is remarkably successful in this technical field. Practically, the resolving power of 0.45 in terms of the $k_1$ factor is readily achievable.

The method of the present invention (Q.U.E.S.T.) does not form a light intensity peak on the x axis and the y axis on the pupil 1 corresponding to the vertical and lateral pattern of the fine pattern, which is different from the usual annular band illumination which does not form an effective light source on the center of the pupil. The arrangement of the peak of the effective light source on the x axis and the y axis causes remarkable drop of the image contrast, failing to give sufficient focal depth. Therefore, in projection of an image constituted of vertical and lateral fine patterns, the illumination of the present invention gives improved image quality in comparison with the annular band illumination.

The quantity of light (light intensity) in each of the portions of the effective light source can be controlled to be uniform or to be nonuniform as Gaussian distribution.

As described above, the modified illumination (Q.U.E.S.T.) employed in the present invention gives much higher resolving power in comparison with an ordinary annular band illumination.

The use of the modified illumination exposure and the development method of high resolution of the present invention enables the formation of ultrafine resist pattern of as fine as 0.2 µm even when different dimension or different shape of patterns exist in the resist pattern. This could not be achieved by prior art technique. Further the method of the present invention enables remarkable increase of focus margin in comparison with conventional methods.

EXAMPLE 1

A first example of the present invention is described in reference to drawings.

Figure 5:
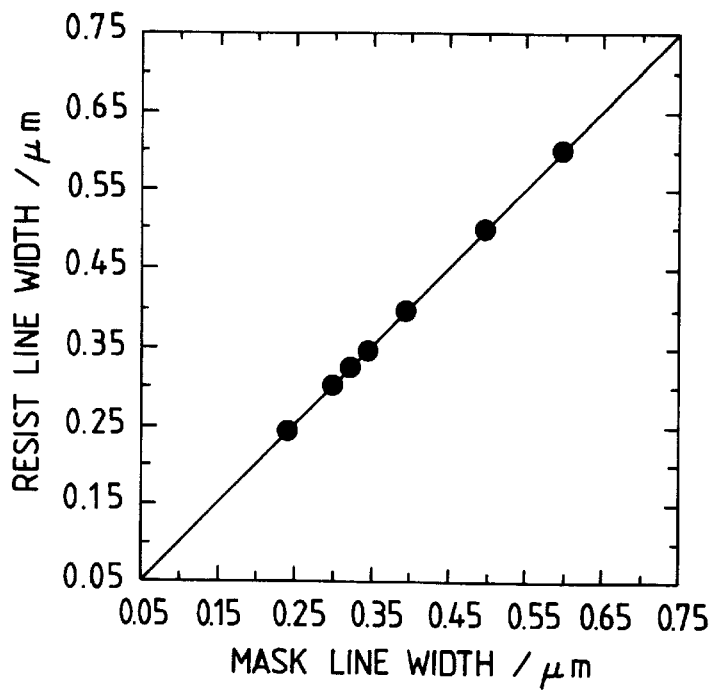
FIG. 5 is a graph showing mask fidelity of a resist pattern developed with a developing solution of the present invention.

FIG. 5 shows fidelity to design of the line-space pattern of a resist which have been exposed by an i-line reduction aligner employing the modified illumination (Q.U.E.S.T.) and developed with the developing solution of the present invention. In this example, THMR-ip2800 (made by Tokyo Ohka Kogyo Co., Ltd.) was used as the resist, but the kind of the resist is not limited in the development by use of the developing solution of the present invention.

The surfactant used in the present Example is an amine type anti-foaming surfactant having an ethylene-propylene block in a branched chain group. Any lithographic developer may be used so long as it contains the surfactant capable of increasing the dissolution of a resist in a smaller resist region. That is, in a developer used to develop a resist pattern having regions with different sizes and shapes, by dissolving and removing a resist region of a resist layer formed in the resist pattern, any surfactant may be used so long as it is capable of increasing the dissolution of a resist in the resist region to be dissolved and removed, having a smaller dissolving-and-removing area on the surface of said resist layer.

Using these resist and developer, contact holes were formed through a developing step, and were thereafter observed on a scanning electron microscope.

FIG. 6 illustrates a transfer mask used in the designing of contact holes. Their actual size corresponds to the size of ⅕ on a mask 601. On an n-type (100) silicon substrate of 5 inches diameter, a resist layer (resist: THMR-ip2800, trade name, available from Tokyo Ohka Kogyo Co., Ltd.) with a layer thickness of 0.7 µm was formed.

As shown in FIG. 6, each of the nine mask sections has a test pattern 602 with 16 holes therein.

Figure 7A:
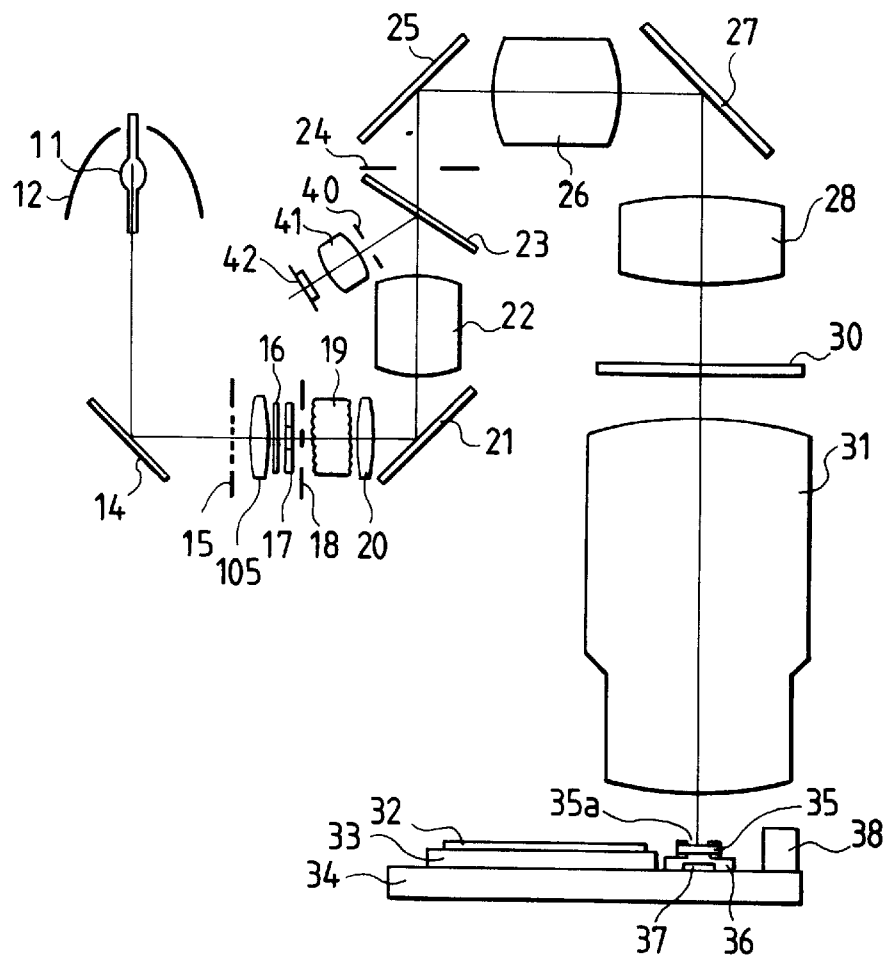
FIG. 7A illustrates schematically an aligner which employs the deformation illumination (Q.U.E.S.T) of the present invention.
Figure 7B:
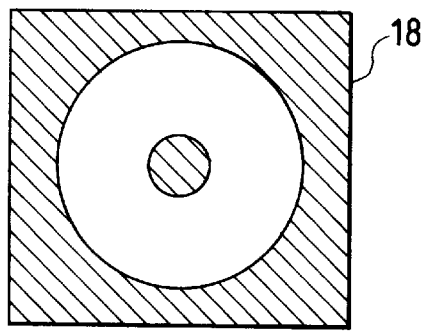
FIG. 7B illustrate schematically a front view of an aperture member in FIG. 7A.
Figure 7C:
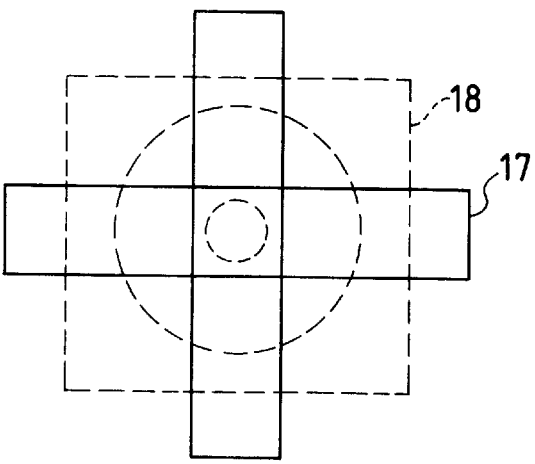
FIG. 7C illustrates a cross filter in FIG. 7A.

The test pattern 602 was projected through the aforementioned mask 601 by demagnification of the ratio of 5:1 by means of an i-line demagnification projection aligner shown in FIG. 7 by employing modified illumination. FIGS. 7A, 7B, and 7C illustrate schematically the aligner of the present invention.

In FIG. 7A, the numeral 11 denotes an extra-high pressure mercury lamp, the light-emitting portion thereof being placed at the first focus of an ellipsoidal mirror 12; the numerals 14, 21, 25, and 27 denote respectively a deflecting mirror; 15, a shutter for controlling the quantity of light projection; 105, a filed lens; 16, an interference filter for wavelength selection; 17, a cross ND filter; 18, aperture member having a predetermined opening; 19, an optical integrator, the plane of incidence being placed at the second focus of the ellipsoidal mirror 12; 20 and 22, lenses of a first image-forming lens system; 23, a half mirror; 24, a masking blade having a rectangular opening for controlling the illumination area on the mask; 26 and 28, lenses of the second image-forming lens system; 30, a mask having a pattern formed thereon; 31, a demagnification projection lens system for projecting the pattern of the mask 30 in demagnification ratio of 1/5; 32, a wafer coated with a resist; 33, a wafer chuck for holding the wafer 32 by sucking; 34, an XY stage for holding the wafer chuck 33; 35, a glass plate having an opening 35a at the center and having a light-intercepting film formed thereon; 36, a case having an opening at the upper face; 37, a photoelectric transducer placed in the case 36; 38, a mirror constituting a part of a laser interferometer not shown in the drawing for measuring the movement of the stage 34; 40, a light-intercepting plate placed at a position equivalent optically to the light-receiving face of the blade 24 and having a predetermined opening on which light fluxes projected from the lenses of the integrator 19 are superposed as on the blade 24; 41, a condenser lens for condensing the light from the light-intercepting plate 40; and 42, a four-division detector.

The construction of this apparatus is characterized by the filter 17 and the aperture member 18 which are placed before the integrator 19. The aperture member 18 is an aperture stop, as shown in FIG. 7B, having a ring-shaped opening to intercept light to the area around the light axis and defining the size and the shape of the effective light source on the face of the pupil of the projection lens system 31. The center of this opening coincides with the optical axis of the apparatus. The filter 17 is constituted by arranging four ND filters in a cross state as a whole. By these four ND filters, the intensities of the light introduced to four positions on the ring-shaped opening of the aperture member 18 are attenuated by 10% to 100%. The four positions corresponds to regions including four points on the xy axes on the pupil face of the lens system 31 corresponding to the vertical and lateral patterns on the mask 30. Thus the filter 17 decreases the light intensities of the effective light source on the xy axes on the pupil face of the projecting lens system.

The mask 30 is held by a mask stage not shown in the drawing. The projection lens system 31 is designed to receive the i-line (wavelength: 365 nm) selected by the filter 16. The first and the second image-forming lens system (20, 22, 26, 28) are placed such that the light-emitting plane of the integrator 19 and the pupil face of the projection lens system 31 are conjugated, and the second image-forming lens system (26, 28) is placed such that the edge of the opening of the blade 24 and the pattern portion of the mask 30 are conjugated. The blade 24 is usually constituted of four independently movable light-intercepting plates having a knife-edge-shaped tip, and the positions of the respective light-intercepting plate are controlled by the instruction of a computer not shown in the drawing for controlling the entire apparatus.

The half mirror 23 reflects a part of the light flux from the integrator 19. The light reflected by the mirror 23 is introduced through the opening of the light-intercepting plate 40 to the lens 41, and is condensed on the four-division detector 42 by the lens 41. The light-receiving face of the four-division detector 42 is placed so as to be equivalent optically to the pupil plane of the projection lens system 31, thereby the ring-shaped effective light source formed by the aperture member 18 being projected onto the light-receiving face.

The four-division detector 42 outputs signals from individual detectors in accordance with the light intensity received by the respective light-receiving face, the signals for controlling the opening degree of the shutter 15 being given by addition of the output signals from the four-division detector 42.

The members 35, 36 and 37 on the XY stage 34 serves as a measuring unit for checking the performance of the illumination system above the mask 30. The XY stage 34 moves to the predetermined position to check the illumination system, and brings the measuring unit just below the projection system 31. In this measuring unit, the light introduced from the illumination system to the image plane of the projection system 31 is introduced through the opening 35a of the glass plate 35 and the opening or the case 36 to the photoelectric transducer 37. The light receiving face of the opening 35a is placed at the image plane of the projection lens system 31, and if necessary, the height of the opening 35 is adjusted in the direction of the optical axis of the apparatus by means of a focus detection system (a known sensor for detecting the height of the surface of the wafer 32) not shown in the drawing and a measuring unit driving system built in the XY stage 34. The glass plate 35 is fitted to a case 36, and the case 36 has an opening at the center. A measuring unit is provided to move the opening of the case 36 relative to the glass plate 35. The opening of the case 36 is placed at a position where the NA of the projection lens system 31 at the image plane side is large and which is sufficiently distant from the image plane. Therefore, the light distribution on the pupil plane of the projection system 31 is reproduced on the light receiving plane at the opening of the case 36. In this example, the measuring unit is not used. The usage of the measuring unit is explained in the later Example.

In this Example, by use of the filter 17 and aperture member 18, the pattern on the mask 30 was illuminated at uniform illuminance through the illumination system (11, 12, 14, 15, 105, 16, 17, 18, 19, 20, 21, 22, 23, 24, 25, 26, 27, 28), while an effective light source was formed on the pupil plane in the projection system 31. The effective light source was in a ring shape as a whole and the intensity was lower at the four areas including the xy axes corresponding to the vertical and lateral patterns on the mask 30. Thereby the pattern image is projected onto a wafer 32 to transfer the pattern image thereon.

The filter 17 and the aperture member 18, which are placed before the integrator 19 in this Example, may be placed immediately after the integrator 19. An aperture member 18 which is shown in FIG. 11B and is used in Example 2 may be used in place of the filter 17 and the aperture member 18 of this Example.

The kind of the resist pattern apparatus gives no effect in the present invention. Therefore any other resist patterning apparatus may be used.

Subsequently, the sample was immersed in a developing solution of this Example for 70 seconds, and washed with ultrapure water for 60 seconds to form a pattern. The space between the spaces was twice the pattern size. For example, the holes of 0.3 $\mu$m the space therebetween was 0.6 $\mu$m. In this Example, holes having sized of from 0.5 to 0.3 $\mu$m were prepared.

Figure 8:
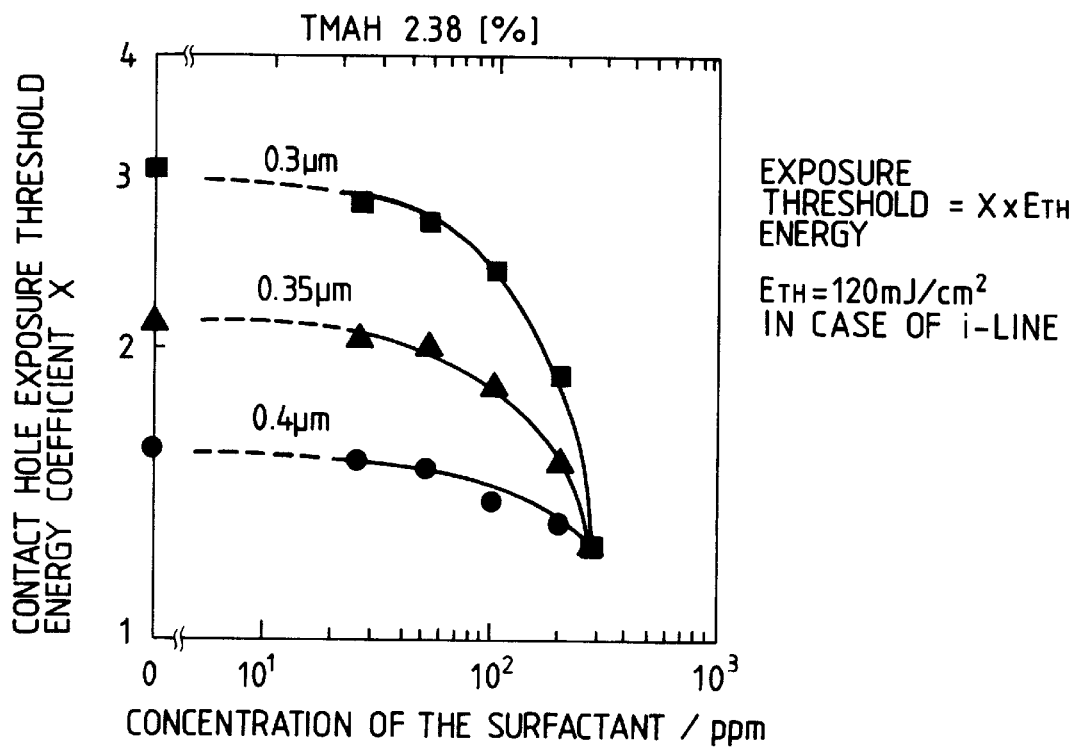
FIG. 8 shows dependency of the exposure threshold energy for hole pattern formation on the concentration of the surfactant in Examples of the present invention.

FIG. 8 shows dependency of the exposure threshold energy for hole pattern formation on the concentration of the surfactant. With the increase of the surfactant concentration, remarkable decrease of the exposure threshold energy was observed for small size of holes. For the 0.4 $\mu$m pattern, the exposure threshold energy depended little on the surfactant concentration, while for smaller pattern of 0.35 $\mu$m or 0.3 $\mu$m, the exposure threshold energy remarkably lowered with the increase of the surfactant concentration. At the surfactant concentration of 300 ppm or higher, the hole pattern of 0.3 $\mu$m was formed under the same exposure conditions as larger hole patterns. This phenomenon is caused by the ability of the developing solution of the present invention which exhibits higher dissolving power for a smaller size of patterns.

Figure 9:
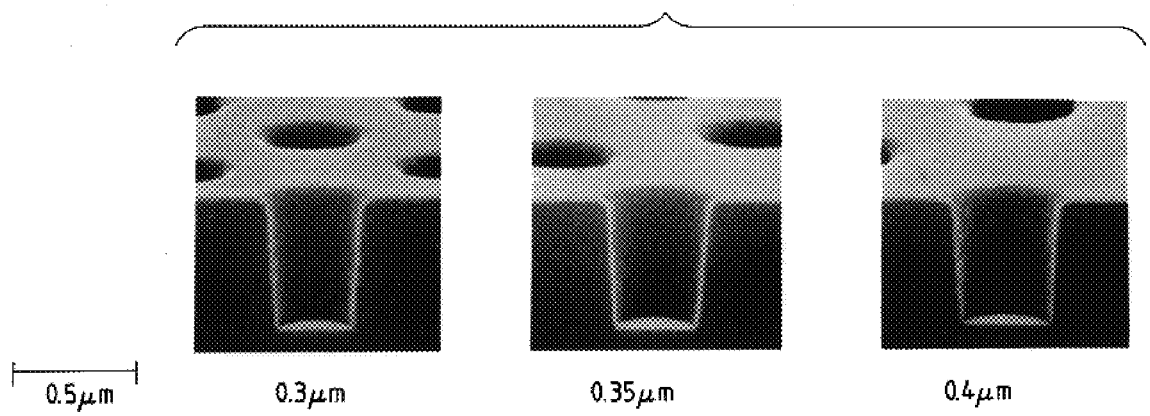
FIG. 9 shows photographs of hole profiles of patterns of 0.3 µm, 0.35 µm, and 0.4 µm formed by use of a developing solution of the present invention and an i-line reduction aligner according to modified illumination (Q.U.E.S.T.).

The developing solution of the present invention was compared with a conventional surfactant-containing developing solution by observing cross-sections of the holes. FIG. 9 shows the hole profiles of patterns of 0.4 $\mu$m, 0.35 $\mu$m, and 0.3 $\mu$m. With conventional surfactant-containing developing solutions, the side wall of the resulting pattern is curved, while with the developing solution of the present invention, the side wall of the hole pattern was formed in a sharp shape. This was caused by the facts that the developing solution penetrates selectively into fine areas, the soluble product diffuses and is eliminated rapidly from the surface of the resist, the smaller pattern is supplied more rapidly with the fresh developing solution, and thereby the development in a smaller pattern area proceeds in the same process as a relatively large pattern area of the resist.

Figure 10:
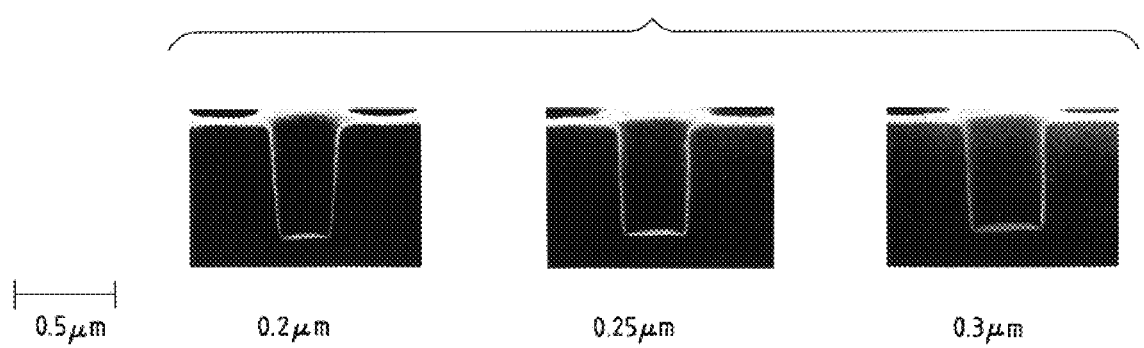
FIG. 10 shows photographs of hole pattern profiles of 0.2 µm, 0.25 µm, and 0.3 µm formed by use of a developing solution of the present invention and an i-line reduction aligner according to modified illumination (Q.U.E.S.T.).

Further, hole patterns of the size of down to 0.2 $\mu$m were formed with the i-line reduction aligner employing modified illumination having the construction shown in FIG. 7. FIG. 10 shows photographs of cross-section of the hole patterns of 0.3 $\mu$m, 0.25 $\mu$m, and 0.2 $\mu$m. The exposure conditions were the same, with the exposure energy of 480 mJ/cm$^2$. As shown by the photographs, the lithography process of the present invention enables precise pattern profiles of down to 0.2 $\mu$m under the same exposure conditions as for the larger patterns, which could not be achieved by conventional developing solutions. This phenomenon can be attained by use of the developing solution which has the ability of development higher for less readily formed more ultrafine pattern.

Consequently, it was confirmed that fine patterns of 0.25 $\mu$m or smaller can be formed as designed irrespective of the size and the shape of the pattern by means of an i-line demagnification projection aligner according to the lithography of the present invention.

EXAMPLE 2

On a 5-inch silicon substrate, 0.7 $\mu$m-thick resist was formed in the same manner as in Example 1. Then a test pattern 602 was projected at a demagnification ratio of 5:1 with the aligner shown in FIG. 11.

Figure 11A:
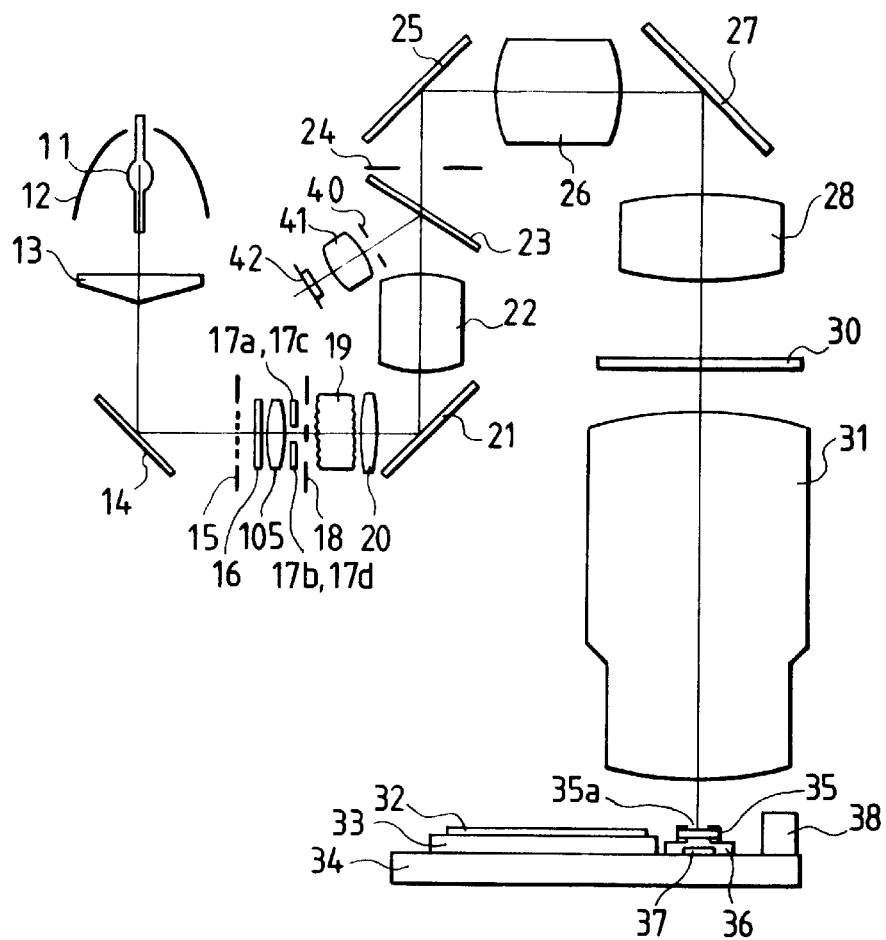
FIGS. 11A and 11B illustrate schematically the aligner employed in Example 2.
Figure 11B:
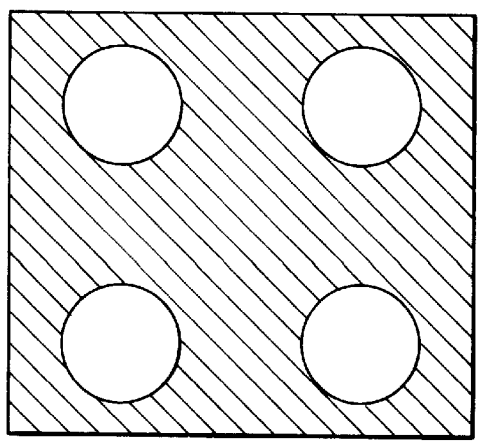

In FIG. 11A and FIG. 11B illustrate another aligner of the present invention, where the members which are the same or have the same function as the ones in FIGS. 7A to 7C are denoted by the same reference numbers. The aligner of FIG. 11 used in this Example is different from the one in FIG. 7 in that the aperture member 18 has four independent openings as shown in FIG. 11B, four independent filters 17a, 17b, 17c, 17d are provided in correspondence with the independent opening of the member 18 in place of the cross ND filter, and a quadrangular pyramid prism 13 is inserted between the mirror 12 and the mirror 14.

In this Example, the output from the four-division detector 42 is employed to the use other than for opening-shutting control and to the measuring units 35–37.

The effects of this Example are described by emphasizing the difference from the above Example.

If the integrator 19 is illuminated with the light of the mercury lamp 11 in the absence of the quadrangle pyramid prism 13, the filters 17a, 17b, 17c, 17d, and the aperture member 18, a secondary light source is formed which has light intensity distribution like a Gaussian distribution having a high peak at the center on the light-emitting plane of the integrator 19. Since the light-emitting plane of the integrator 19 is conjugated with the pupil plane of the projection lens system 31, an effective light source is formed on the pupil plane, having a peak of light intensity distribution at the center of the pupil. As described above, the effective light source which does not have a light intensity peak is employed in the present invention. Therefore, the light incident to the vicinity of the center of the integrator 19 needs to be intercepted as in the above Example. However, the aperture member 18, if it is simply placed before the integrator 19, intercepts most of the light from the mercury lamp, resulting in a large loss of the quantity of light. In this Example, a quadrangle prism 13 is inserted immediately after the ellipsoidal mirror 12 to control the illuminance distribution of the optical integrator 19.

The light-emitting portion of the mercury lamp 11 is placed at the position of the first focal point of the ellipsoidal mirror 12, and the light emitted by the mercury lamp 11 and reflected by the ellipsoidal mirror 12 is deflected by the quadrangle pyramid mirror 13 to form four light fluxes directed to different directions. These four light fluxes are reflected by the mirror 14 and reach the shutter 15. With the shutter 15 opened, the light fluxes enter the filter 16 directly. By the filter 16, the i-line is selected form the emission spectra of the mercury lamp 11 so that the projection lens system 31 which projects the image of the mask 30 onto the resist on the wafer 32 may exhibit the highest performance.

The four light fluxes leaving the filter 16 pass respectively through the field lens 105, and then enter the filters 17a, 17b, 17c, 17d which are the important factor of the present invention. The four filters adjust the light quantity of the four light fluxes to be nearly equal to make symmetric the light quantities of the four portions of the effective light source formed on the light-emitting plane of the integrator 19 and on the pupil plane. For adjusting the light attenuation function of the filters, the ND filers may be exchanged, or otherwise the filters may be constructed from an interference filter and the interference filters are tilted to utilize the narrow band width characteristics of the interference filters.

The aperture member 18 receives four light fluxes from the filters 17a, 17b, 17c, 17d. The aperture member 18 has four circular openings as shown in FIG. 11B, the four circular opening respectively correspond one by one to the four light fluxes from the filters 17a, 17b, 17c, 17d. Thus the light fluxes from the four openings of the aperture member 18 illuminate the integrator 19, and form effective light source on the light-emitting plane of the integrator 19 and the pupil plane of the projection lens system 31 in correspondence with the openings of the aperture member 18 as shown in FIG. 3A.

Usually, the shape of the openings of the aperture member 18 corresponds to the fine lenses constituting the integrator 19. For example, if the cross-sections of the fine lenses are hexagonal, the openings are hexagonal correspondingly.

The light from the integrator 19 is directed to the blade 24 through the lens 20, the mirror 21, the lens 22, and the half mirror 23. As described above, the light fluxes from the respective lenses of the integrator 19 overlap each other on the blade 24, and illuminate the blade 24 with uniform illuminance. The half mirror 23 reflects a part of the respective light fluxes introduced from the respective lenses of the integrator 19 and the reflected light illuminates the light-intercepting plate 40. The light from the opening of the light-intercepting plate 40 is condensed by the lens 41 on the four-division detector 42.

The light having passed through the opening of the blade 24 is directed to the mask 30 by the mirror 25, the lens 26, the mirror 27, and the lens 28. Since the opening of the blade 24 and the pattern portion of the mask 30 are conjugated with each other, the light fluxes from the respective lens of the integrator 19 overlaps also on the mask 30 and illuminate the mask 30 with uniform illuminance. The image of the pattern of the mask 30 is projected by the projection lens system 31.

The detectors of the four-division detector 42 corresponds respectively to the separate four portions of the effective light source as shown in FIG. 3A, and detect the quantity of light of the respective portion independently. The opening degree of the shutter 15 is controlled by the sum of the output of the respective detectors as already mentioned. The balance of the light quantities in respective portions of the effective light source is checked by comparing the output of the respective detectors. The reliability of the check can be raised by mutual calibration of the respective detectors of the four-division detector 42, which will be explained later.

The shape of the effective light source formed on the pupil plane of the apparatus corresponds to the shape of the integrator 19. Since the integrator 19 itself is an assemblage of fine lenses, the light quantity distribution in the effective light source is microscopically separated corresponding to the individual fine lenses, but macroscopically the light quantity distribution as shown in FIG. 3A is realized.

In this Example, the light quantity distribution was checked by means of the light quantity monitor (23, 40–42) and the measuring unit (35–37). The measurement unit (35–37) was moved to the position just below the projection lens system 31 by moving the XY stage 34. The light-receiving face of the opening 35a was placed at the image plane of the projection lens system 31. The light introduced from the illumination system through the opening 35a of the glass plate 35 and the opening of the case 36 to the image plane of the projection lens system 31 is introduced to the photoelectric transducer 37. The glass plate 35 is mounted on the case 36, and the case 36 has an opening at its center. In this Example, the measuring unit is constructed such that the opening of the case 36 may be shifted in a predetermined distance relative to the opening of the glass plate 35. In the illumination by the illumination system of this Example, the four portions of the effective light source appears separately on the upper face of the case 36. The opening of the case 36 is variable in shape and size, so that either each or the entire of the four portions of the effective light source can be detected at one time. The photoelectric transducer 37 has a light-receiving area sufficient for receiving the entire light fluxes passing through the opening 35a of the glass plate 35. If the area of the light-receiving portion is excessively large, thereby deteriorating the response characteristics in the electric system, the response is improved by inserting a condensing lens between the glass plate 35 and the photoelectric transducer 37 to condense the light fluxes from the opening 35a of the glass plate 35 to decrease the area of the light receiving portion of the photoelectric transducer. Further, the uniformity of the illumination on the image plane can be measured by setting the opening of the case 36 so as to detect the four portions of the effective light source at a time and moving the XY stage 34 along the image plane.

The light quantity, or the light intensity, of the respective portions of the effective light source measured by moving the opening of the case 36 is compared with the output from the corresponding detector of the four-division detector 42. Thus the output of the four-division detector 42 can be calibrated by using the photoelectric transducer 37 on the side of the XY stage 34 as a reference detector, thereby variation in the effective light source being monitored stably. The quantity of light in the respective porions of the effective light source is adjusted for matching by detecting the unbalance of the quantity of light between the portions of the effective light source by means of the four-division detector 42 or the photoelectric transducer 37 and thereby adjusting the filter 17a, 17b, 17c, 17d.

In this Example, by use of the aperture member 18 shown in FIG. 11B, the pattern on the mask 30 is illuminated at uniform illuminance through the illumination system (11, 12, 13, 14, 15, 16, 17, 18, 19, 20, 21, 22, 23, 24, 25, 26, 27, 28), while an effective light source is formed which has not a light quantity distribution peak on the xy axes corresponding to the vertical and lateral pattern on the mask as shown in FIG. 3A and on the center of the pupil (optical axis). Thereby the pattern image is projected by the projection lens system 31 onto a wafer 32 to transfer the pattern image ont the resist on the wafer 32.

Then the transferred pattern image is developed in the same manner as in Example 1. Consequently, it was confirmed that the pattern down to 0.2 $\mu$m can be formed as designed, as in Example 1, which is not achievable by prior art.

EXAMPLE 3

On a 5-inch silicon substrate, 0.7 $\mu$m-thick resist was formed in the same manner as in Example 1. Then a test pattern 602 was projected at a demagnification ratio of 5:1 with the aligner shown in FIG. 12.

Figure 12:
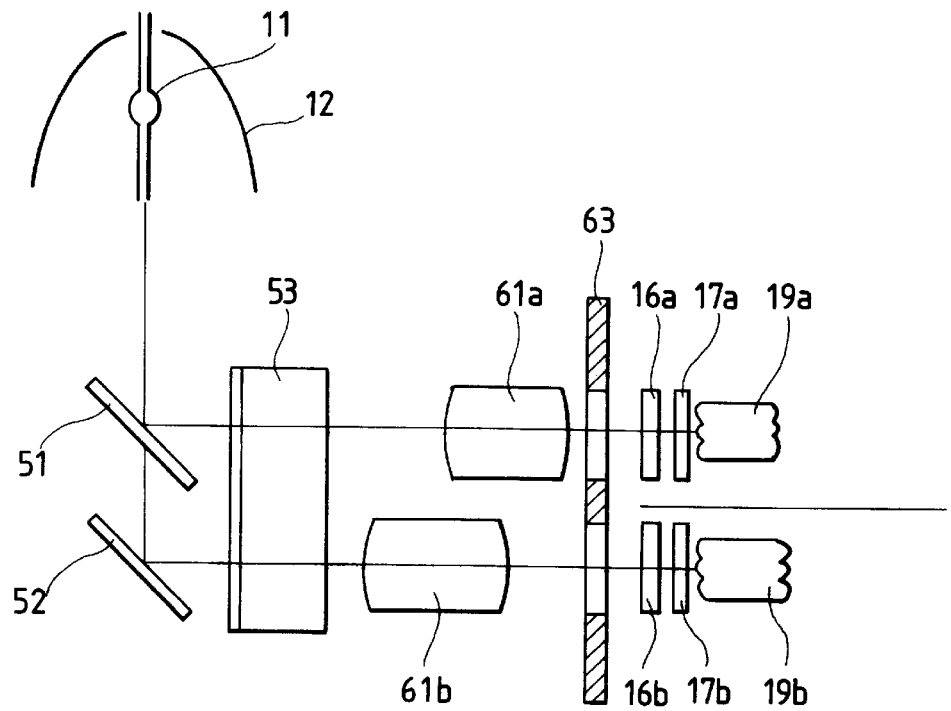
FIG. 12 illustrates schematically the aligner employed in Example 3.

FIG. 12 illustrates schematically an improved part of the aligner of FIG. 11. The members which are the same as the ones in FIG. 11 are denoted by the same reference numbers.

In FIG. 12, the numeral 11 denotes an ultrahigh pressure mercury lamp, and the numeral 12 denotes an ellipsoidal mirror. The light from the ellipsoidal mirror is split by beam splitters (a first beam splitter 51 and a second beam splitter 53) to obtain an effective light source having four parts as shown in FIG. 3A. The numeral 52 denotes a light deflecting mirror. The second beam splitter 53 is placed obliquely to the optical path to cover the two light paths of the light beams formed by the first beam splitter 51, and splits further the two light fluxes travelling along the paper plane of drawing to deflect a portion of the respective light beams in a direction perpendicular to the paper plane of the drawing. The undeflected portions of the respective light beams travel along the paper plane as shown in the drawing. Another optical system is provided on the paths of the portions of the light beams deflected by the second beam splitter 53, and reflects the light beams in a direction parallel to the undeflected light. The four light fluxes formed by the beam splitters 51, 53, the mirror 52, and a mirror optical system not shown in the drawing constitute a secondary light source having light distribution as shown in FIG. 3A on the light emitting plane of the integrator 19. Thereby effective light source shown in FIG. 3A is formed on the pupil plane of the projection lens system 31.

On the two split light paths on the paper plane, relay lenses 61a, 61b are provided which condense the light of the respective light paths on the integrator 19. Since the lengths of the two optical paths differ slightly from each other owing to the presence of the first beam splitter, the construction and the focal lengths of the relay lenses differs a little. The same is true in a pair of the relay lenses placed on the pair of the light paths outside the paper plane and not shown in the drawing.

The shutter 63 intercepts or passes the four light fluxes formed by the beam splitters 51, 53 respectively. Wavelength-selecting filters 16a, 16b are provided on the two split light paths on the paper plane. The same filters are provided on the other two light paths outside the paper plane. These filters take out the i-line from the light of the mercury lamp 11 similarly as the filter 16 in the preceding Example. Filters 17a, 17b are placed on the two split light paths on the paper plane and are used to adjust the quantities of the light of respective portions of the effective light source. The same filters are provided for the other light paths outside the paper plane. These filters have the same function as the filters 17a, 17b, 17c, 17d in the preceding Example.

In this Example, since the light path to the integrator is split into four paths spatially, the integrator is constructed by assemblage of four small integrators. Because of the spatial arrangement of the light paths, only the integrators 19a, 19b are shown in the drawing.

The construction after the integrators is the same as in the preceding Example, so that further explanation is omitted.

The transferred pattern image is developed in the same manner as in Example 1. Consequently, it was confirmed that the pattern down to 0.2 $\mu$m can be formed as designed, as in Example 1, which is not achievable by prior art.

EXAMPLE 4

On a 5-inch silicon substrate, 0.7 $\mu$m-thick resist was formed in the same manner as in Example 1. Then a test pattern 602 was projected at a demagnification ratio of 5:1 with the aligner shown in FIG. 13.

Figure 13:
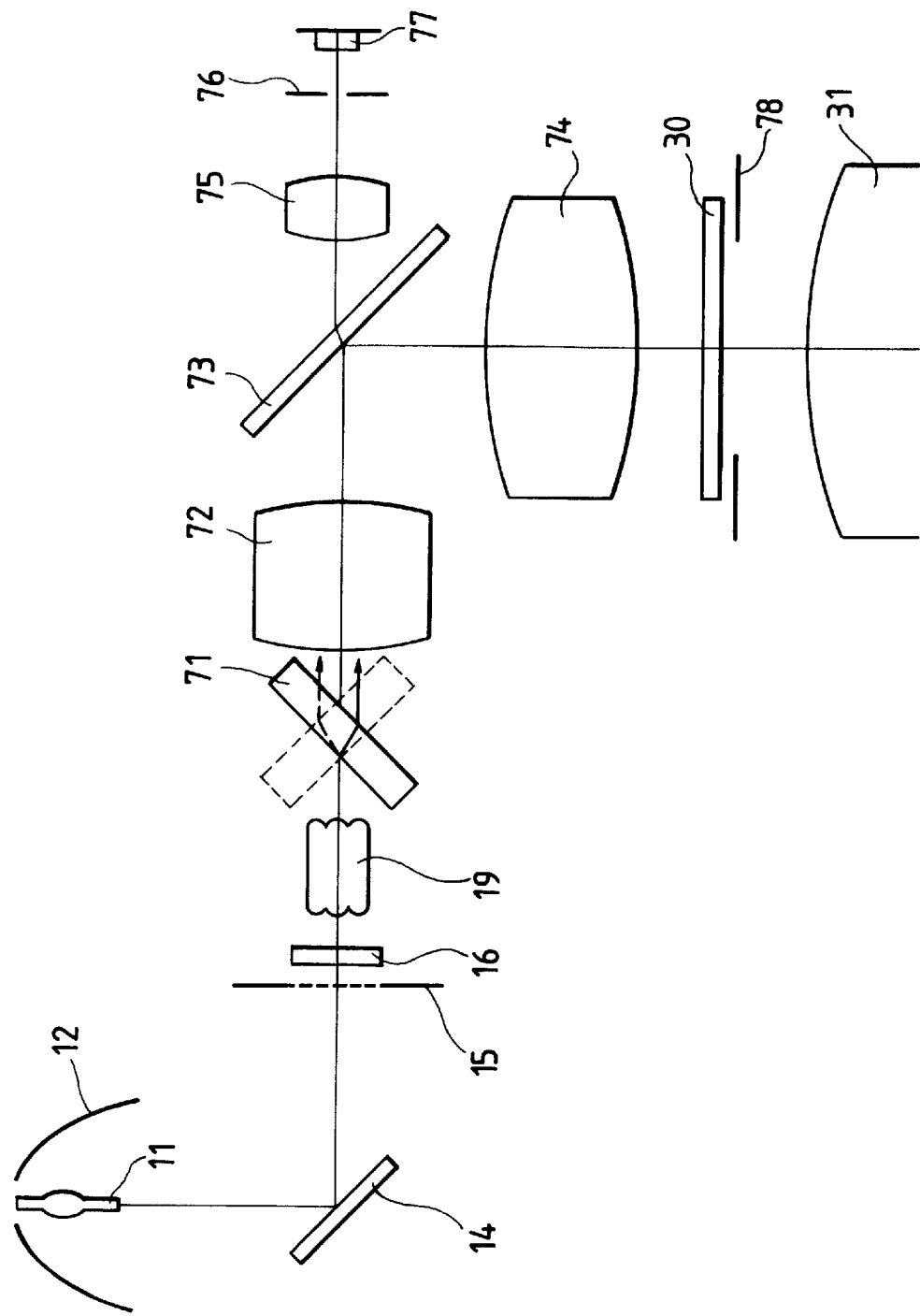
FIG. 13 illustrates schematically the aligner employed in Example 4.

FIG. 13 illustrates schematically a part of still another aligner of the present invention.

The apparatus in this Example projects a pattern image on the pupil plane by moving the position of the effective light source with time to form the effective light source equivalent to that shown in FIG. 3A.

In FIG. 13, the members which are the same as in the preceding Examples are denoted by the same reference numbers. Accordingly, the numeral 11 denotes an extra-high pressure mercury lamp; 12, an ellipsoidal mirror; 14, a deflecting mirror; 15 a shutter; 16, a wave-selecting interference filter; and 19 an optical integrator. The projection lens system 31 and the systems thereafter are the same as in the preceding Examples, and are not shown in the drawing.

The construction of the present invention is characterized by the parallel-face plate 71 which move with time and are placed at the back of the integrator 19. The parallel-face plate 71 are placed in a direction oblique to the optical axis of the illuminating optical system and are made to swing to change the slanting angle to the optical axis as shown in the drawing, thereby shifting the optical axis. When the integrator 19 is viewed from the side of the mask 30 through the parallel-face plate 71, the integrator appears to move up and down or left and right with the swing of the parallel-face plate 71. The parallel-face plate 71 is held also to be rotatable around the optical axis. Therefore, a singly effective light source can be formed on a desired position on the periphery of a circle having a certain radius from the optical axis (the center of the pupil) by rotating the parallel-face plate 71 around the optical axis at a slanting angle to the optical axis. In the practical exposure, the parallel-face plate 71 is moved to a desired position and fixed there, and then exposure is conducted for a required time. This procedure was repeated four times for the respective four portions of effective light source as shown in FIG. 3A, thereby completing the one shot of exposure.

In this Example, the mercury lamp 11 is used as the light source. If the light source is a pulsed light source like an excimer laser, the exposure may be controlled such that the parallel-face plate 71 is moved continuously and the light source is made to emit light at the predetermined position of the parallel-face plate 71. When an excimer laser is used as the light source, it is convenient to adjust the cycle of the rotation of the parallel-face plate 71 to be equal to the light emission cycle of the excimer laser. For example, with a laser of light emission of 200 Hz, efficient light exposure is conducted by controlling the rotation of the parallel-face plate 71 such that the effective light source moves to the adjacent quadrant at every light emission.

By use of such a system of moving a single effective light source with time, the intensities of the separated effective light source portions on the pupil plane is readily made equal to each other at all times.

For this reason in this Example, the filter 17 is not employed which corrects the quantity of light of the effective light source as is employed in the preceding Examples.

The light having passed through the parallel-face plate 71 then passes through the lens 72, the half mirror 73, and the lens 74 and illuminates the mask 30 uniformly. In this Example the first image-forming optical system which is employed in the preceding Examples is not employed. Instead, a blade 78 which is different from the blade 24 of the preceding Examples is placed in proximity to the mask 30. This blade 78 has the same construction and the same function as the blade 24, and capable of varying the size of the opening in correspondence with the size of the pattern formed on the mask 30.

The mirror 73 reflects most of the incident light, and transmits a part of the incident light to introduce it to a light intensity monitor for light exposure control. The light from the mirror 73 is condensed by a condenser lens 75 on a pinhole plate 76 which is placed at a position optically equivalent to the mask 30. The light passing through the pinhole of the pinhole plate 76 is received by a photodetector 77, which output a signal in accordance with the intensity of the incident light. A computer not shown in the drawing controls the opening of the shutter 15 according to the signal. In this Example, the light intensity ratio of the portions of the effective light source need not be monitored. Therefore, the photodetector 77 need not be a four-division detector.

In this Example, the pattern on the mask 30 is illuminated uniformly, while the effective light source as shown in FIG. 3A is formed on the pupil plane of the projection lens system 31. Thereby the pattern image is projected onto a wafer by the projection lens system 31 to transfer the pattern image onto the resist on the wafer.

The transferred pattern image is developed in the same manner as in Example 1. Consequently, it was confirmed that the pattern down to 0.2 μm can be formed as designed, as in Example 1, which is not achievable by prior art.

EXAMPLE 5

On a 5-inch silicon substrate, 0.7 μm-thick resist was formed in the same manner as in Example 1. Then a test pattern 602 was projected at a demagnification ratio of 5:1 with the aligner shown in FIG. 14.

Figure 14:
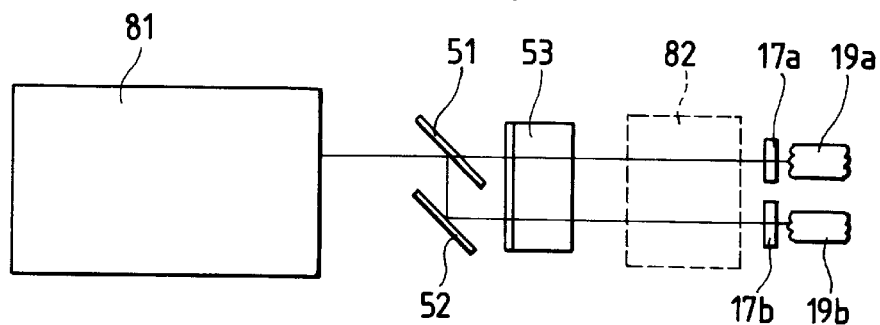
FIG. 14 illustrates schematically the aligner employed in Example 5.

FIG. 14 illustrates schematically a part of still another aligner of the present invention.

In this Example, the light source used is a KrF excimer laser 81 (central wavelength: 248.4 nm, band width: 0.003 to 0.005 nm). The exposure is controlled by control of the laser itself without using a shutter since the excimer laser emits light in pulse. No interference filter is used for selecting the wavelength since the laser itself has a filter and the band width of the laser light is narrow. The beam splitters 51, 53, the mirror 52, the filter 17 and the integrator 19 function in the same manner as in Example shown in FIG. 12. The systems after the integrator 19 are the same as those in FIG. 11A except that the projection light system not shown in the drawing is designed for wavelength of 248.4 nm and is constituted of an lens assemblage mainly composed of synthetic silica.

In use of the excimer laser 81, occurrence of speckle pattern have to be suppressed since the laser light exhibits high coherence. Therefore, in this Example, an incoherent unit 82 is placed after the beam splitters 51–53. Many methods are known for the removal of speckles for excimer laser illuminating systems. Any of these methods is applicable since the formation of the effective light source of the present invention is consistent inherently with these known methods. Accordingly, the unit 82 is not detailedly explained here.

The pattern on the mask is illuminated uniformly, while the effective light source as shown in FIG. 3A is being formed on the pupil plane of the projection lens system not shown in the drawing by the optical system (17, 19, 51, 52, 53, 82) shown in the drawing. Thereby the pattern image is projected onto a wafer by the projection lens system to transfer the pattern image onto the resist on the wafer.

The transferred pattern image is developed in the same manner as in Example 1. Consequently, it was confirmed that the pattern down to 0.2 μm can be formed as designed, as in Example 1, which is not achievable by prior art.

EXAMPLE 6

On a 5-inch silicon substrate, 0.7 μm-thick resist was formed in the same manner as in Example 1. Then a test pattern 602 was projected at a demagnification ratio of 5:1 with the aligner shown in FIG. 15.

Figure 15:
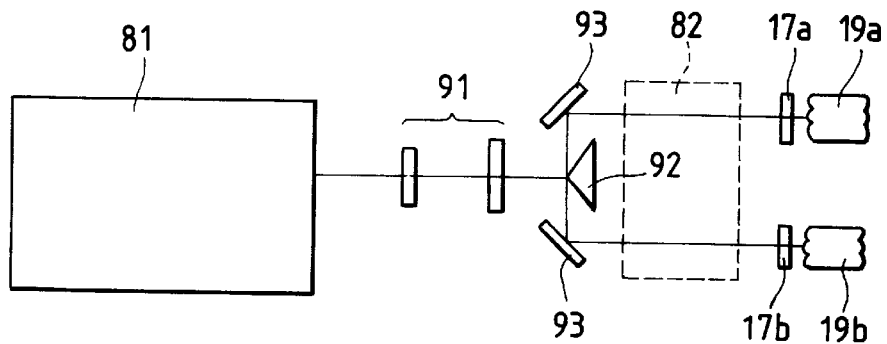
FIG. 15 illustrates schematically the aligner employed in Example 6.

FIG. 15 illustrates schematically a partial view of improved apparatus obtained by modifying the apparatus of FIG. 14.

The laser beam emitted by the laser 81 is divided into four light fluxes by use of a reflection type quadrangle prism. In the apparatus shown in FIG. 11, the light flux is divided by transmission type quadrangle prism. The same separation can be conducted by the reflection type prism. In this Example, the light source used is a KrF excimer laser. However, the constitution of the present invention can naturally be realized with an extra-high pressure mercury lamp. The laser light emitted by the laser 81 is enlarged to a suitable beam size by an afocal converter 91, and is introduced to the quadrangle prism 92. The quadrangle prism is placed such that the four reflection planes form an effective light source as shown in FIG. 3B on the pupil position of the projection lens system not shown in the drawing. The mirror 93 deflects the light which have been split and reflected by the respective reflection plane of the quadrangle prism 92. The construction after the mirror 93 is the same as in the apparatus shown in FIG. 14, and the systems after the integrator 19 is the same as those shown in FIG. 11A. The projection lens system is designed for the light of 248.4 nm The pattern on the mask is illuminated uniformly, while the effective light source as shown in FIG. 3A is being formed on the pupil plane of the projection lens system not shown in the drawing by the optical system (17, 19, 91, 92, 93, 82) shown in the drawing. Thereby the pattern image is projected onto a wafer by the projection lens system to transfer the pattern image onto the resist on the wafer.

The transferred pattern image is developed in the same manner as in Example 1. Consequently, it was confirmed that the pattern down to 0.2 μm can be formed as designed, as in Example 1, which is not achievable by prior art.

EXAMPLE 7

On a 5-inch silicon substrate, 0.7 μm-thick resist was formed in the same manner as in Example 1. Then a test pattern 602 was projected at a demagnification ratio of 5:1 with the aligner shown in FIG. 16.

Figure 16:
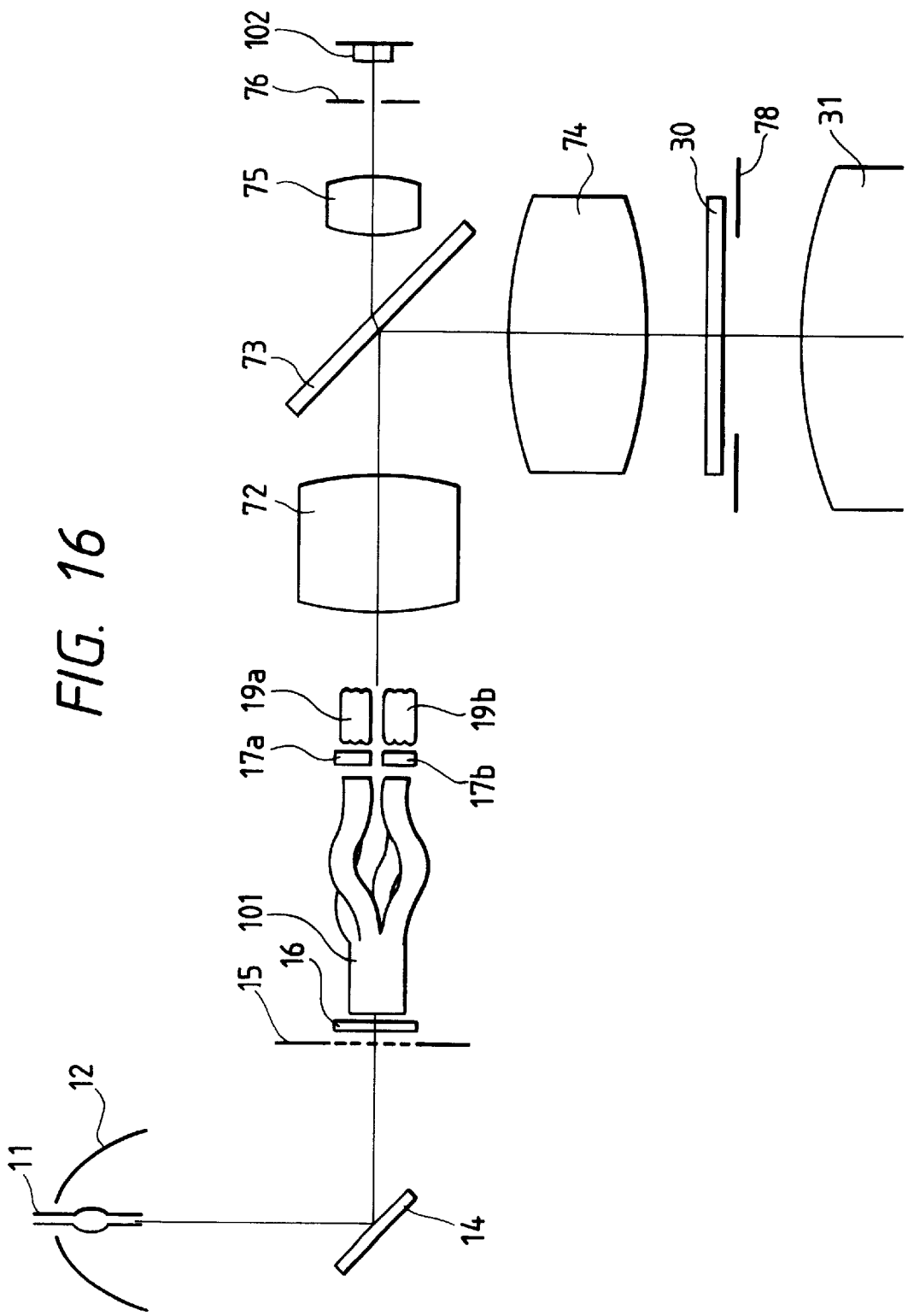
FIG. 16 illustrates schematically the aligner employed in Example 7.

FIG. 16 illustrates schematically a part of still another aligner of the present invention.

A fiber bundle 101 is employed in the illumination system. The light incidence plane of the fiber bundle 101 is placed at the position where the light from the extra-high pressure mercury lamp 11 is condensed by the ellipsoidal mirror 12, and the light fluxes are introduced through the fiber bundle to the light incidence plane of the integrator 19. The other end of the fiber bundle 101 not facing to the extra-high pressure mercury lamp 11, namely the light-emitting plane is branched into four bundles, each of the bundles corresponds to the portions of the effective light source shown in FIG. 3A. At the outlet of the each branched fiber bundle, a filter 17 is respectively placed for adjusting the quantity of light of the portions of the effective light source. The optical systems after this are in the same construction as in Example shown in FIG. 13 except that a four-division detector 102 is used as the photodetector of the light intensity monitor for measuring the balance of the quantities of light from the respective branched fiber bundles (four portions of the secondary light source and four portions of the effective light source). The individual detectors of the four-divisional detector 102 correspond respectively to the outlet of the four integrators 19.

The pattern on the mask is illuminated uniformly, while the effective light source as shown in FIG. 3A is being formed on the pupil plane of the projection lens system 31. Thereby the pattern image is projected onto a wafer by the projection lens system to transfer the pattern image onto the resist on the wafer.

The transferred pattern image is developed in the same manner as in Example 1. Consequently, it was confirmed that the pattern down to 0.2 μm can be formed as designed, as in Example 1, which is not achievable by prior art.

EXAMPLE 8

On a 5-inch silicon substrate, 0.7 μm-thick resist was formed in the same manner as in Example 1. Then a test pattern 602 was projected at a demagnification ratio of 5:1 with the aligner shown in FIG. 17.

Figure 17:
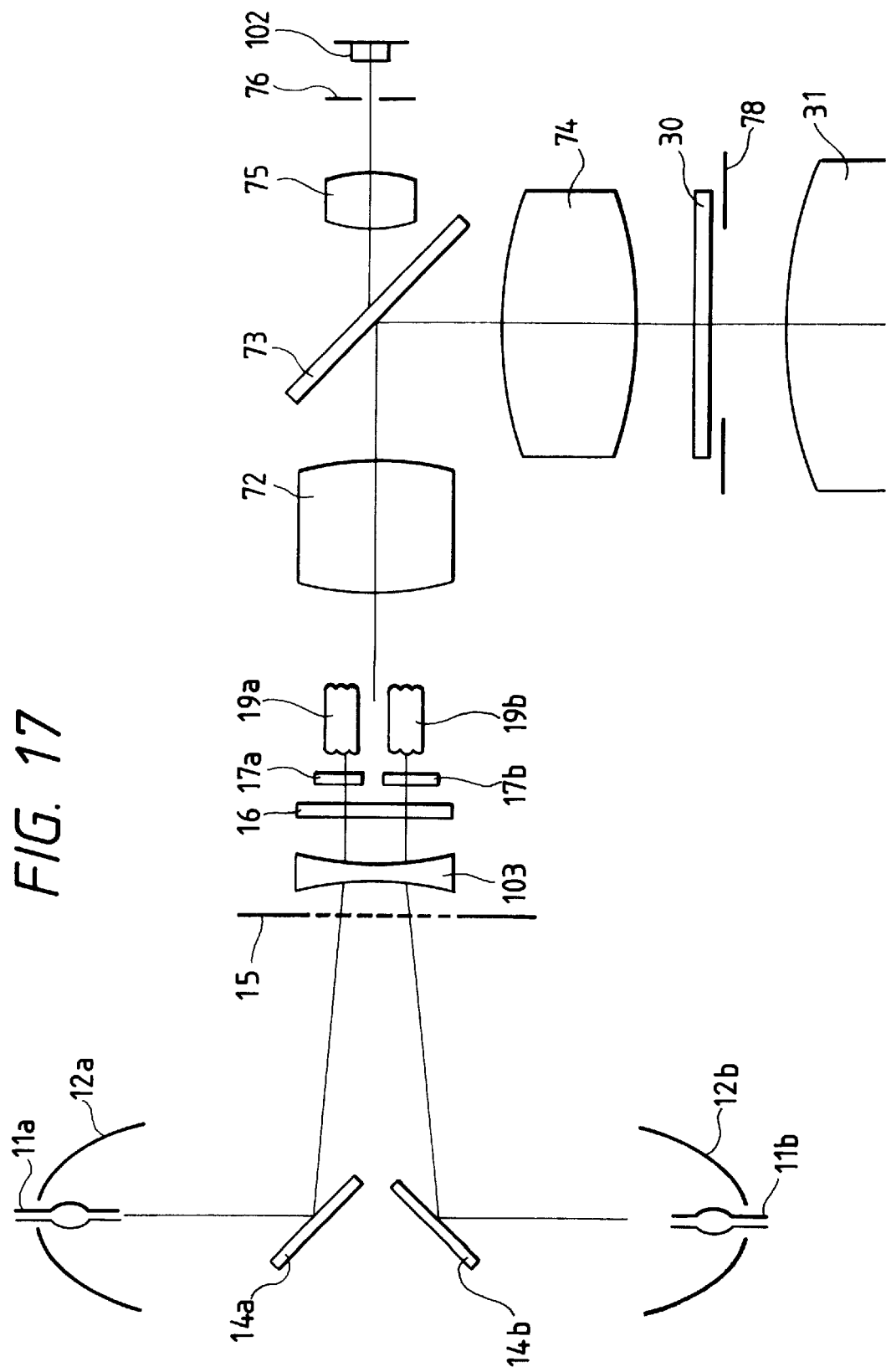
FIG. 17 illustrates schematically the aligner employed in Example 8.

FIG. 17 illustrates schematically a part of still another aligner of the present invention.

The illumination system employs a plurality of light sources. In this Example, the light sources comprised ultra-high pressure mercury lamps 11a, 11b. However, an excimer laser may be used as the light sources to construct an optical laser system, namely an optical system for parallel and less divergent beams.

In this Example, four ultrahigh pressure mercury lamps are used, although only two lamps are shown in the drawing because of the superposition owing to the two-dimensional expression. The fluxes from the four ultrahigh pressure mercury pumps pass through a concave lens 103, a interference filter 16 for wavelength selection, and four filters 17 for adjusting the quantities of respective portions of the effective light source, and then reach the integrators 19. The construction of the optical system after the integrators 19 is the same as in the apparatus shown in FIG. 16. Thereby, the effective light source as shown in FIG. 3A is shown on the pupil plane of the projection lens system 31.

In this Example also, the pattern image was projected by the projection system 31 onto a wafer to transfer the pattern image on the wafer.

The transferred pattern image was developed in the same manner as in Example 1. Consequently, it was confirmed that the pattern down to 0.2 μm could be formed as designed, as in Example 1, which is not achievable by prior art.

In the apparatuses described above, the arrangement of the effective light source on the pupil plane is fixed. However, as described before, the optimum values of the parameter "p" representing the position of the center of a portion of the effective light source and the parameter "q" representing the radius of the portion of the light source, or of a circumcircle thereof, and the optimum shape of the each portion depends on the kind of the pattern to be projected and exposed. Accordingly, in the apparatus in each Example, the system is preferably constructed so that the parameters p and q are variable. For example, when an aperture member 18 is employed, the shape of the opening of the aperture member 18 may be made variable, or a plurality of apertures are provided which have various shapes of the openings.

EXAMPLE 9

This Example is described by reference to FIGS. 18 to 22.

Figure 18:
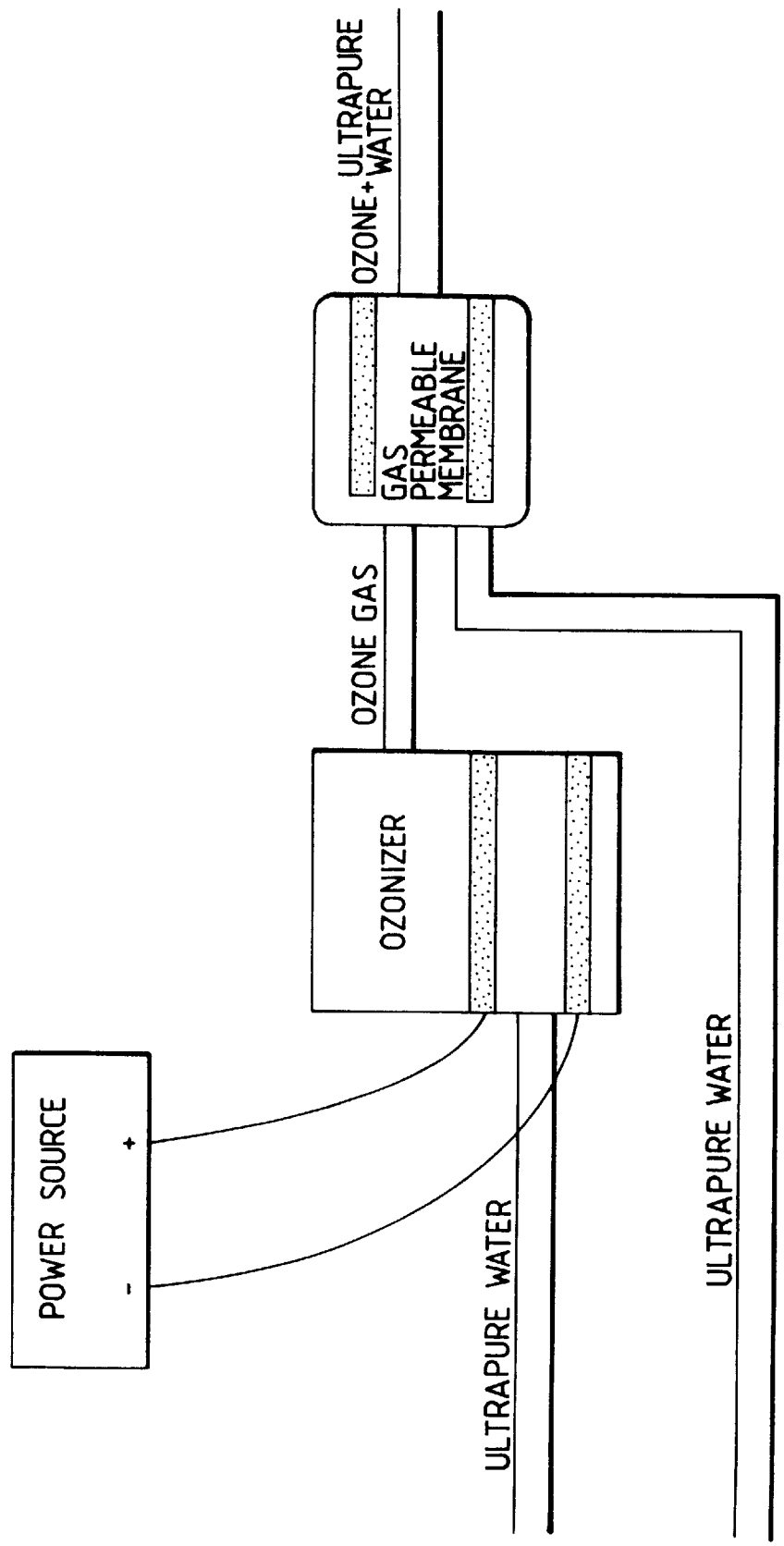
FIG. 18 illustrates schematically a process for producing ozone-containing ultrapure water.

FIG. 18 illustrates schematically a process for producing ozone-containing ultrapure water used for washing with ultrapure water rinse. This apparatus generates ozone by electrolysis of ultrapure water and dissolves the ozone in ultrapure water. The ozone generator is a commercial one without special treatment. With this apparatus, the concentration of ozone in the ultrapure water can be controlled accurately and stably in the range of from 0.01 ppm to 10 ppm.

Figure 19A:
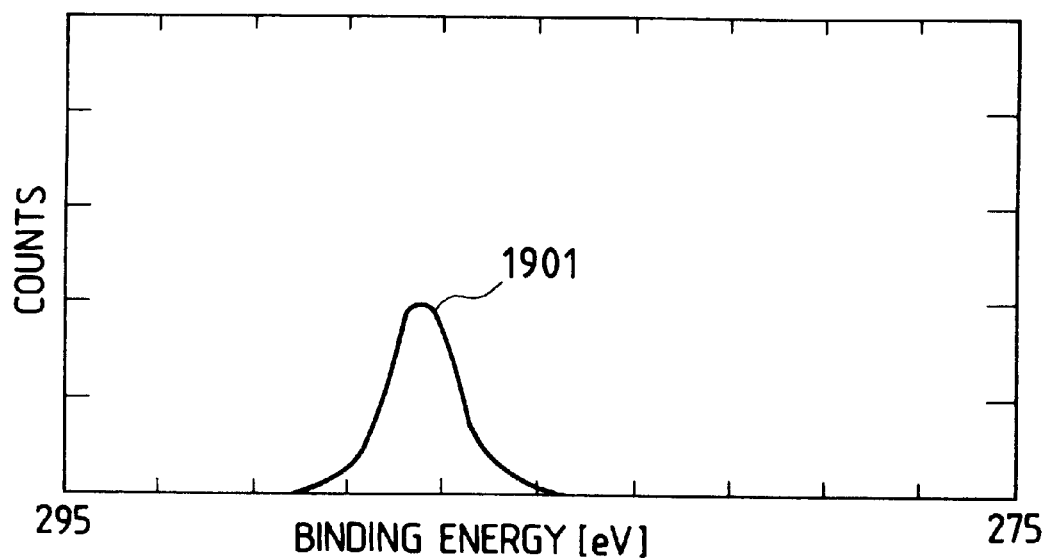
FIGS. 19A and 19B show XPS spectra which exhibits that the surfactant is eliminated from the silicon surface by washing with ozone-containing ultrapure water.
Figure 19B:
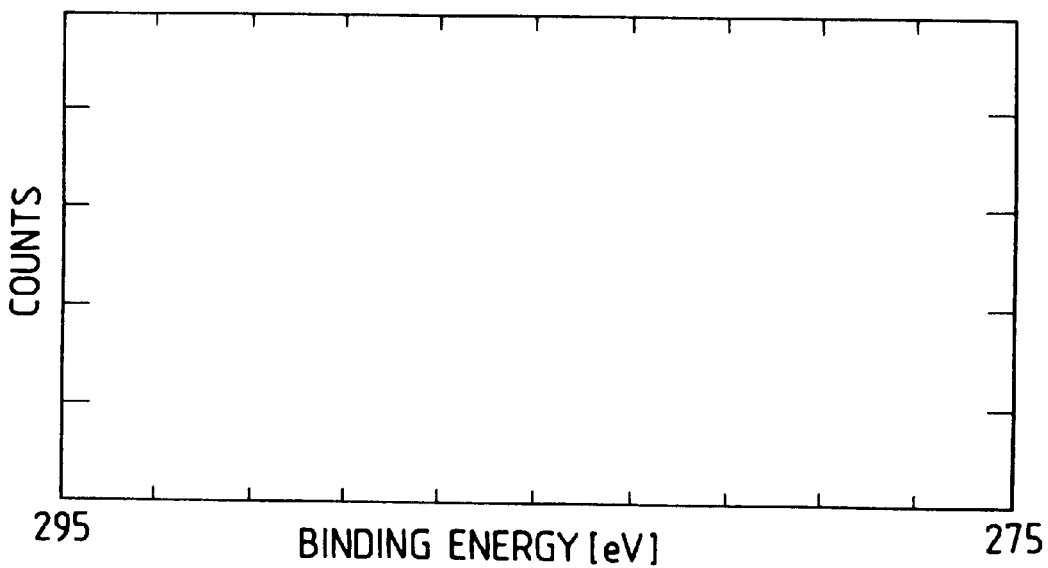

FIGS. 19A and 19B show the 1s peak of carbon of X-ray photoelectric spectra of samples of silicon wafers which have been immersed for 60 seconds in the developing solution of the present invention: one having been rinsed with ultrapure water for 60 seconds, and the other having rinsed with ultrapure water containing ozone at a concentration of 2 ppm. While the peak 1901 of the surfactant is detected on the silicon surface rinsed with simple ultrapure water, no peak 1901 is detected on the surface rinsed with ultrapure water containing 2 ppm ozone. Thus the surfactant adsorbed on the surface of the silicon was confirmed to be decomposed and eliminated by rinsing with ozone-containing ultrapure water. It was also confirmed that the same effect could be achieved with ultrapure water containing 0.1 ppm ozone when the rinsing was conducted for 10 minutes.

Figure 20:
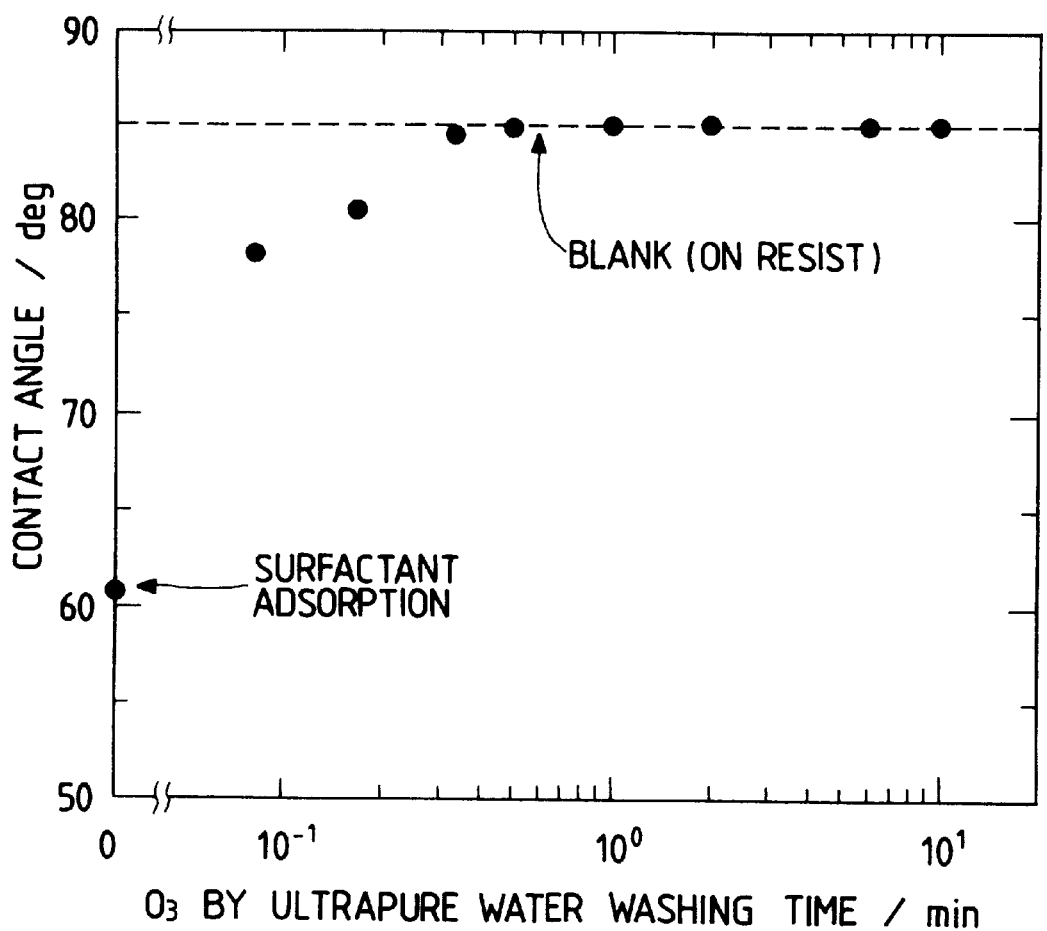
FIG. 20 is a graph showing according to contact angle measurement that the surfactant is eliminated from the resist surface by washing with ozone-containing ultrapure water.

Separately, a sample having thin film of an unexposed resist formed thereon was immersed for 60 seconds in a surfactant-containing developing solution of the present invention, and thereby the surfactant was adsorbed on the surface. The surface was treated with ultrapure water containing 2 ppm ozone. Then the contact angle of ultrapure water on the surface of the surface of the sample was measured. FIG. 20 shows the removal of the surfactant from the resist surface as a function of the ozone-containing ultrapure water rinsing time. The contact angle before the rinsing was larger than that of a clean resist surface owing to the presence of the surfactant adsorbed thereon. On the contrary, the contact angle came to be completely equal to that on a clean resist surface after the rinse with ultrapure water containing 2% ozone for 60 seconds or longer, whereby the surfactant was confirmed to be removed.

A resist pattern of 0.3 μm thick was prepared in the same manner as in Example 1, and was washed with ultrapure water containing 2% ozone.

Figure 21A:
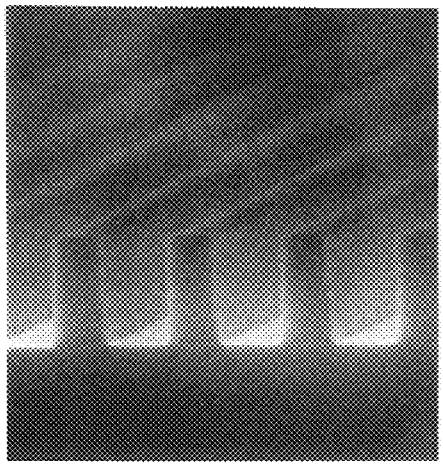
FIG. 21A and FIG. 21B are photographs which exhibit line-and-space pattern of 0.28 µm before washing (FIG. 21A) and after washing (FIG. 21B) with ozone-containing ultrapure water.
Figure 21B:
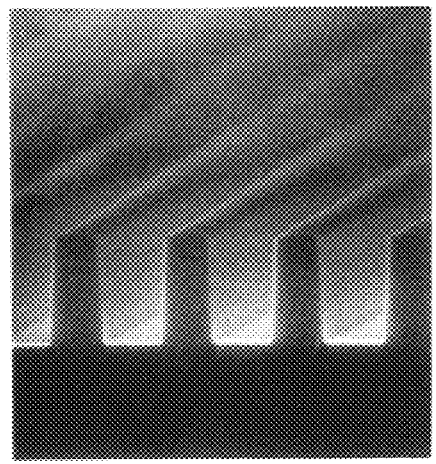

FIGS. 21A and 21B show profiles of resist pattern of 0.3 μm thick before and after the washing with ultrapure water containing 2% ozone. The resist pattern profiles does not change at all by the washing, whereby it was confirmed that the ozone does not give adverse effect such as deformation of the resist pattern.

FIGS. 22A and 22B are photographs of the surface of wafers which had been immersed in the developing solution (FIG. 22B) or a conventional developing solution (FIG. 22A) and washed with ultrapure water containing 2 ppm ozone. It was confirmed that the immersion in the conventional developing solution containing no surfactant causes surface roughness of the silicon, while the immersion in the developing solution of the present invention causes no surface roughness.

EXAMPLE 10

Line-and-space patterns of 0.4 μm, and 0.35 μm were formed by exposition with an i-line demagnification projection aligner with modified illumination (Q.U.E.S.T) in the same manner as in Example 1 by varying the focal length. The developing solution was NMD-3 (made by Tokyo Ohka Co., Ltd., TMAH: 2.38%) containing 400 ppm of a surfactant, Epan 610 (made by Dai-ichi Kogyo Seiyaku Co., Ltd., (A+C)/(A+B+C)=0.1, molecular weight: 1944). The conditions of the resist pattern formation are shown in Table 1.

The line-and-space patterns obtained by use of the resist and the developing solution shown in Table 1 were observed by scanning electron microscopy. The results are shown FIGS. 24A1–24A4 and 24B1–24B3. In FIGS. 24A1 24A4 and 24B1–24B3, the F-value is a measure of the position of the focal point, and the best focus was +0.4 μm in this Example.

As shown in FIGS. 24A1–24A4 and 24B1–24B3, sharp patterns were obtained with either of the resist, MCPRi6600 and THMRip1800, for the 0.4 μm pattern, in the range of from F=−1.1 μm to 1.9 μm for 0.4 μm pattern with the focus margin of about 3 μm; and for the 0.35 μm pattern in the range of from F=−0.6 μm to 1.4 μm with the focus margin of about 2 μm.

As shown above, the photolithography process of this Example enables more stable patterning with remarkably large focus margin.

The same results were obtained by use of another surfactant, Epan 420 (molecular weight; 1200, ratio of hydrophilic group: 20%), or Epan 720 (molecular weight:2000, ratio of hydrophilic group: 20%) in place of the above surfactant Epan 610.

EXAMPLE 11

Contact holes were formed by exposition with an i-line demagnification projection aligner with modified illumination (Q.U.E.S.T) in the same manner as in Example 10 by varying the concentration of the surfactant in the developing solution. The developing solution was NMD-3 (made by Tokyo Ohka Co., Ltd., TMAH: 2.38 wt %), and the surfactant was Epan 610 (made by Dai-ichi Kogyo Seiyaku Co., Ltd., (A+C)/(A+B+C)=0.1, molecular weight: 1944).

Figure 25:
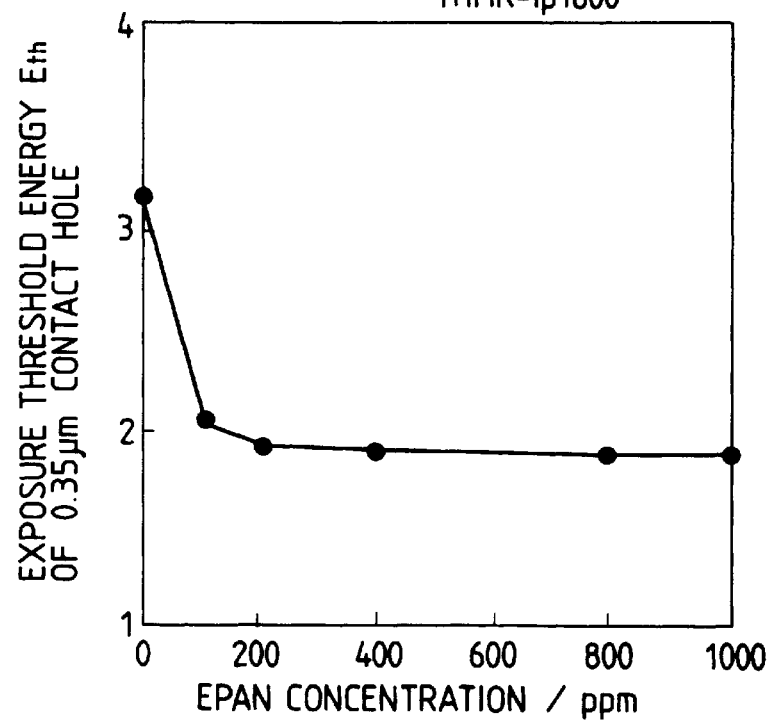
FIG. 25 is a graph showing the dependency of exposure threshold energy for a contact hole formation on the concentration of the surfactant.
Figure 28:
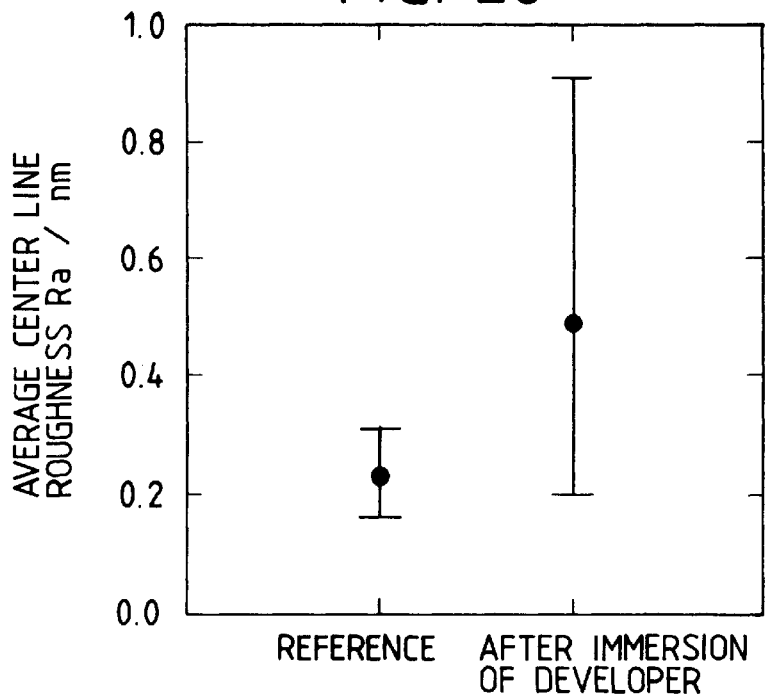
FIG. 28 is a graph showing the change of the average center line roughness by immersion in a developing solution on a silicon surface.

The dependency of exposure threshold energy for various sizes of contact hole patterns on the surfactant concentration in the developing solution was investigated. The differences in exposure threshold energy among contact holes decreased with the increase of the added amount of the surfactant. The exposure threshold energy value was constant in the surfactant concentration range of from 100 to 1000 ppm as shown in FIG. 25.

The photolithography process of the present invention enables the formation of fine resist patterns composed of various sizes and various shapes of pattern components down to 0.2 μm in ultrahigh density integrated semiconductor processes. The process of the present invention feasible practically the production of higher level of ultrahigh density and ultrahigh speed LSI.

TABLE 1

| | | MCPRi6600 | THMR-iP1800 |
|---|---|---|---|
| Resist formation | Resist | (made by Mitsubishi Chemical Co., Ltd) | (made by Tokyo Ohka Kogyo C., Ltd.) |
| | Film Thickness | 1.085 μm | 1.085 μm |
| | Coating conditions | 23° C., humidity 40% | 23° C., Humidity 40% |
| | Prebake | 80° C., 90 sec | 90° C., 90 sec |
| Exposure | Stepper | stepper made by Canon K.K. NA = 0.52 | stepper made by Canon K.K. NA = 0./52 |
| | Exposure quantity | 1.8 × $E_{TH}$ ($E_{TH}$ = 136 mJ/cm$^2$) | 1.8 × $E_{TH}$ ($E_{TH}$ = 136 mJ/cm$^2$) |
| | Illumination | quadrupole type opening | quadruple type opening |
| Baking after exposure | | 110° C. | 110° C. |
| Development | Developing solution | TMAH 2.38 wt % (NMD-3, made by Tokyo Ohka Kogyo Co., Ltd.) Epan 610, 400 ppm (made by Dai-ichi Kogyo Seiyaku Co., Ltd.) | TMAH 2.38 wt % (NMD-3, made by Tokyo Ohka Kogyo Co., Ltd.) Epan 619, 400 ppm (made by Dai-ichi Kogyo Seiyaku Co., Ltd.) |
| | Conditions | dipping: 70 sec water washing: 60 sec drying by nitrogen blow | dipping: 70 sec water washing: 60 sec drying by nitrogen blow |

What is claimed is:

1. A lithography process for forming a pattern having different sizes or different shapes of pattern components, comprising the steps of:
   (a) exposing a resist to a predetermined light pattern;
   (b) developing the resist to form the resist pattern by employing a lithography-developing solution containing a surfactant at a concentration from 100 ppm to 1,000 ppm to dissolve and remove a region of the resist, said region not greater than 0.5 μm; and
   (c) removing the surfactant from (i) a surface of the resist or (ii) a surface of a basic material of the resist, employing ultrapure water containing ozone in a concentration of not less than 0.1 ppm, the surfactant of the following formula [I]:

$$HO(CH_2CH_2O)_a(CH(CH_3)CH_2O)_b(CH_2CH_2O)_cH \qquad [I]$$

wherein a, b and c are each an integer, and which surfactant satisfies a condition expressed by the following equation:

$$(A+C)/(A+B+C) \leqq 0.2$$

wherein A is a formula weight of the moiety $HO(CH_2CH_2O)_a$, B is a formula weight of the moiety $(CH(CH_3)CH_2O)_b$, and C is a formula weight of the moiety $(CH_2CH_2O)_cH$ in formula [I].

2. A lithography process according to claim 1, wherein the surfactant has an antifoaming property.

3. A lithographic process according to claim 2, wherein the surfactant has a molecular weight of not more than 4000.

4. A lithography process according to claim 1, wherein the surfactant has a molecular weight of not more than 4000.

5. A lithography process according to claim 1, wherein the concentration of the ozone is not less than 2.0 ppm.

6. A lithography process according to claim 1 wherein the surfactant is adsorbed on a surface of the resist or on a surface of a base substrate of the resist is removed by ultrapure water containing ozone in a concentration of not less than 2.0 ppm.

7. The lithography process of claim 1 wherein the surfactant has a molecular weight of not more than 4,000 and the surfactant is present in the lithography-developing solution in a concentration from 400 ppm to 1,000 ppm.

* * * * *

UNITED STATES PATENT AND TRADEMARK OFFICE
CERTIFICATE OF CORRECTION

PATENT NO.   : 6,107,007
DATED        : August 22, 2000
INVENTOR(S)  : Tadahiro Ohmi et al.

It is certified that error appears in the above-identified patent and that said Letters Patent is hereby corrected as shown below:

Title page,
Item [56] References Cited, FOREIGN PATENT DOCUMENTS
"1129250 5/1989 Japan." should be deleted.
Item [56], Primary Examiner
"Werner" should read -- Weiner --.

Sheet 8,
Figure 9 should be deleted.

Sheet 10,
Figure 10 should be deleted.

Sheet 18,
Figure 19B, "EXISTENCE" should read -- PRESENCE --.

Sheet 22,
Figure 23, "FORMING" should read -- FOAMING --.

Figure 26:
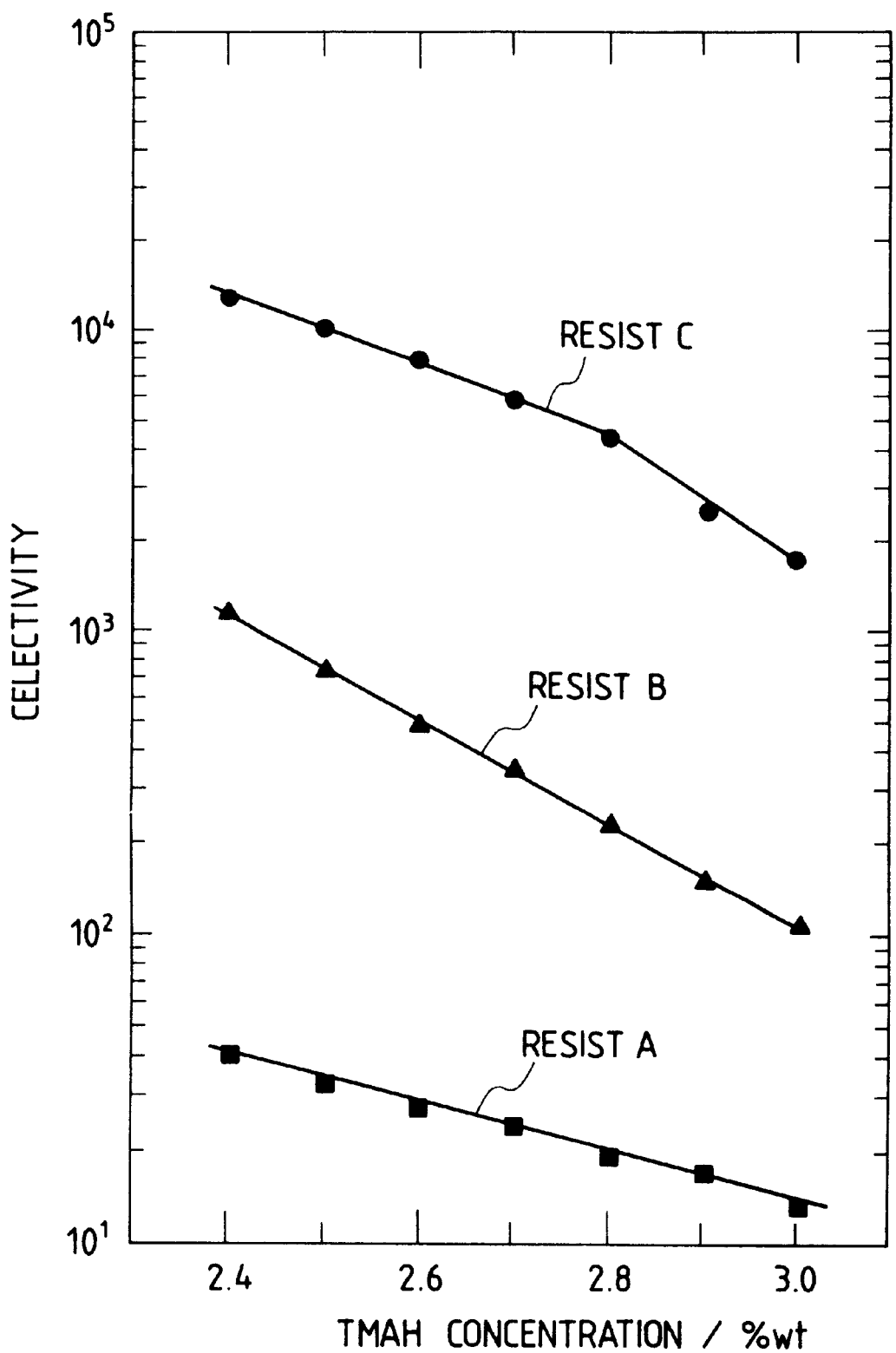
FIG. 26 is a graph showing the dependency of the selectivity of the resist to the developing solution on the TMAH concentration.
Figure 27:
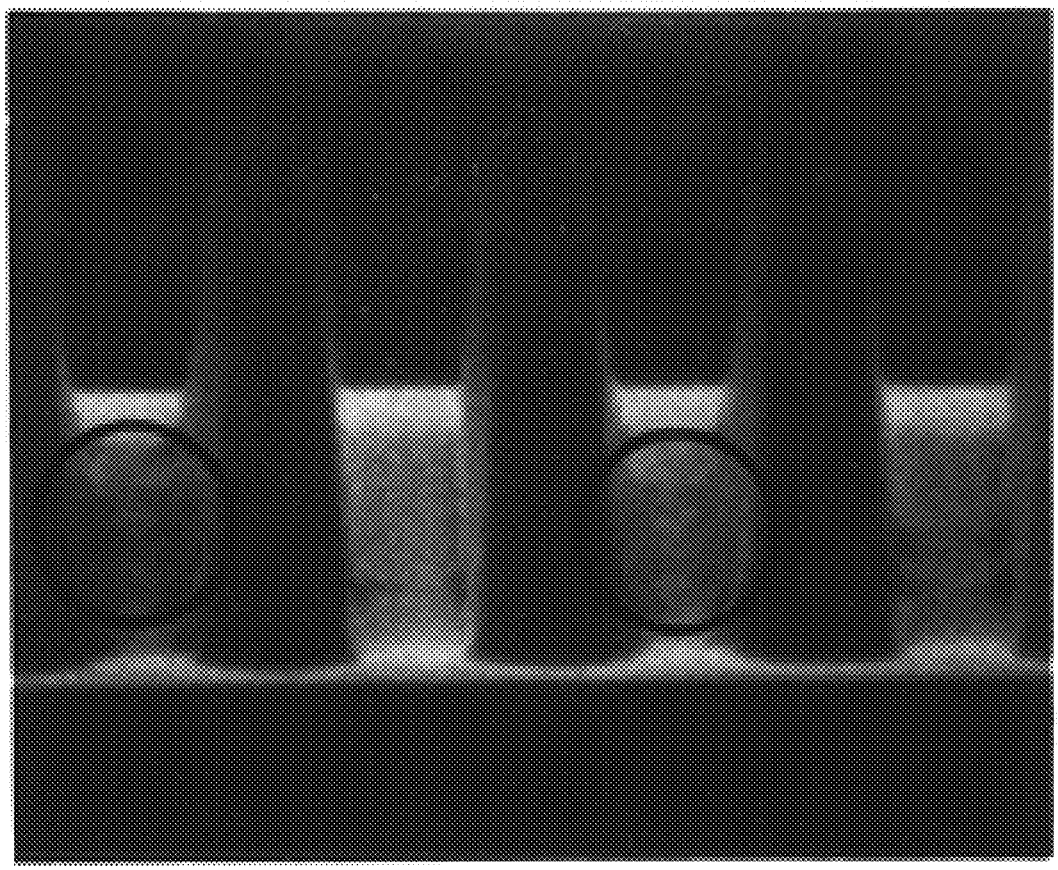
FIG. 27 is a photograph of a 0.55 μm line-and-space pattern formed with a conventional developing solution.
Figure 29:
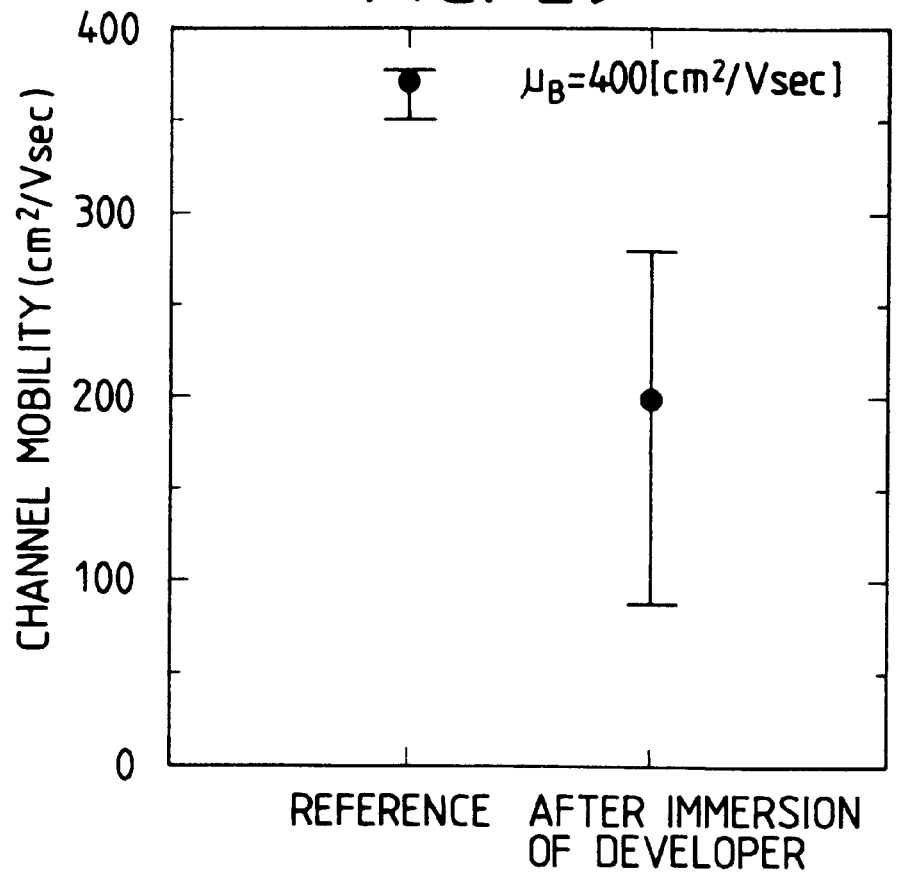
FIG. 29 is a graph showing deterioration of the channel mobility of MOSFET caused by a developing solution.
Figure 30:
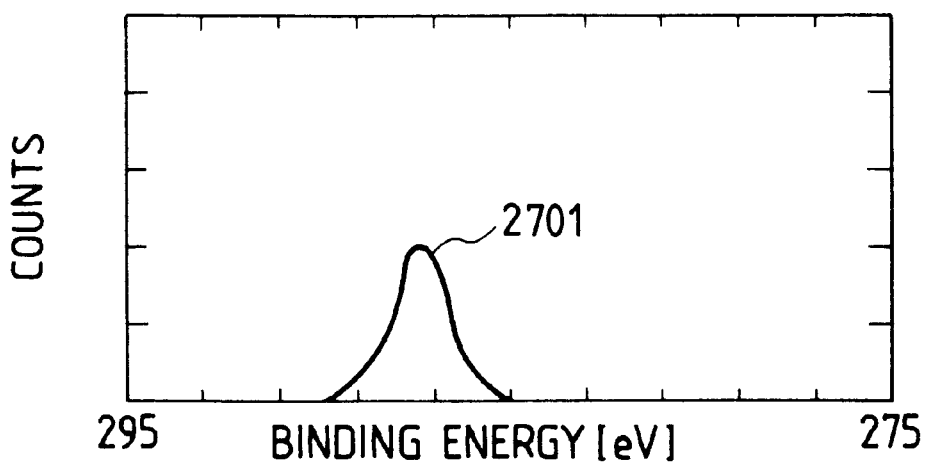
FIG. 30 shows an XPS spectrum which exhibits adsorption of a surfactant onto a silicon wafer surface.
Figure 32:
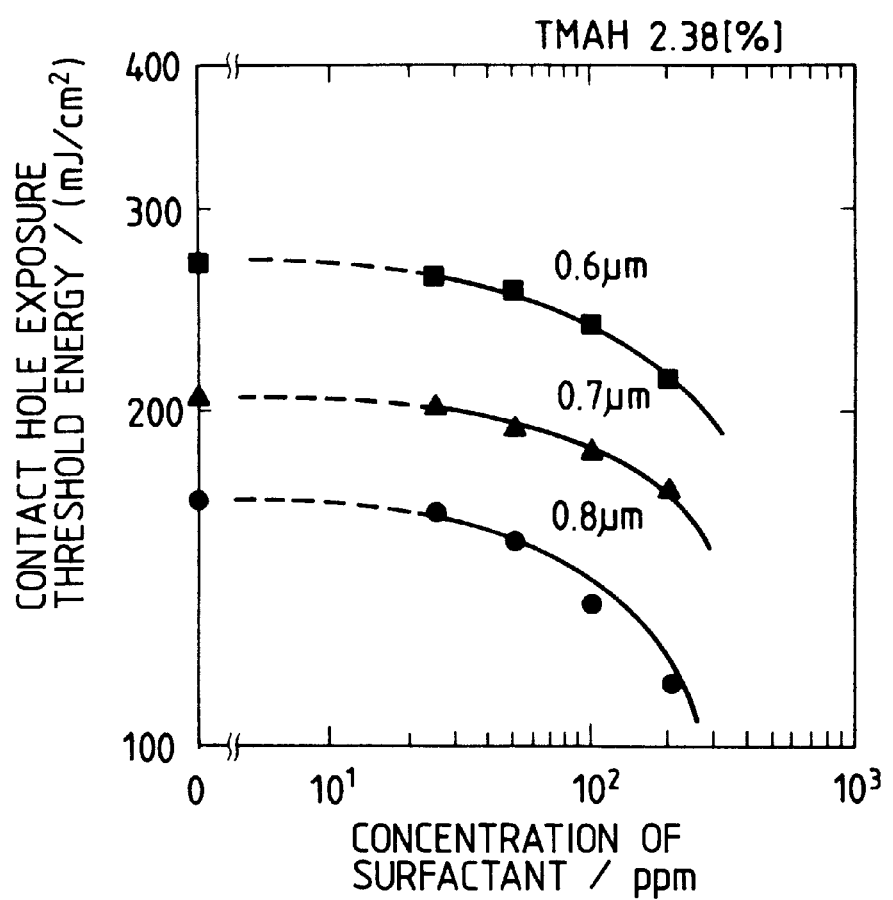
FIG. 32 shows dependency of the exposure threshold energy for hole pattern formation on the concentration of the surfactant with a conventional developing solution.

Sheet 31,
Figure 26, "CELECTIVITY" should read -- SELECTIVITY --.

Column 1,
Line 7, "an," should read -- a --;
Line 31, "functionally" should read -- functional --;
Line 47, delete "2401,".

Column 2,
Line 26, "shows" should read -- show --;
Line 52, "size," should read -- sizes, --.

Column 3,
Line 38, "are" should be deleted;
Line 46, "0.4 $\mu$nm." should read -- 0.4 $\mu$m. --;
Line 49, "extremely a" should read -- an extremely --.

Figure 6B:
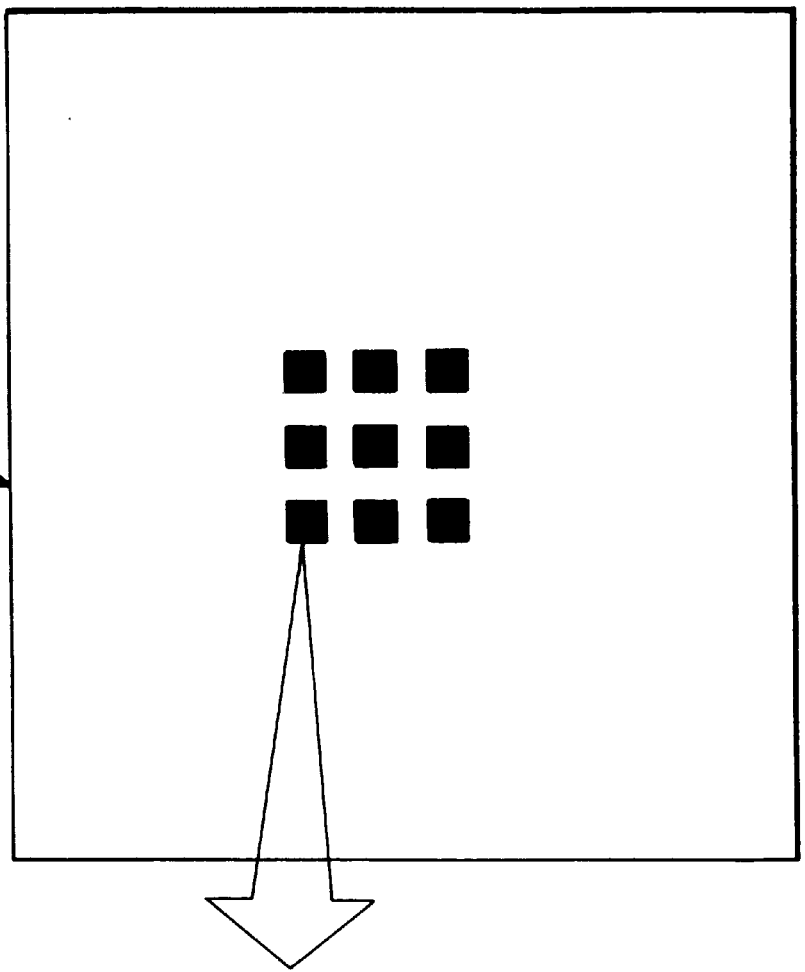
FIG. 6 illustrates schematically a transfer mask used in design of a hole pattern.
Figure 6A:
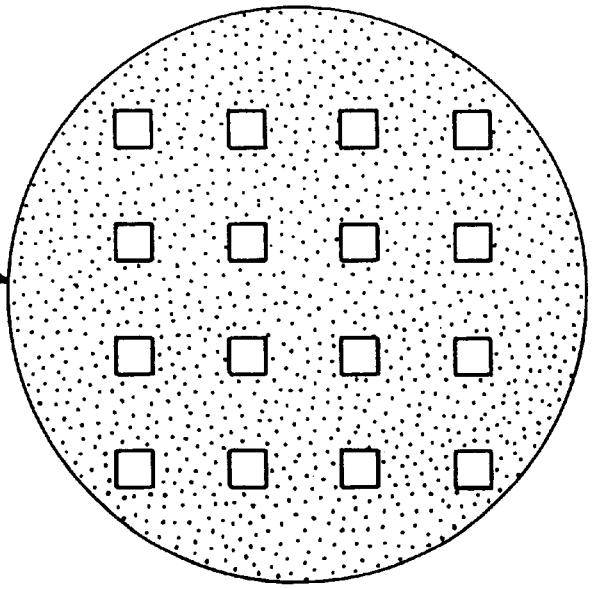
Figure 9A:
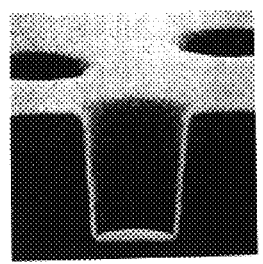
Figure 9B:
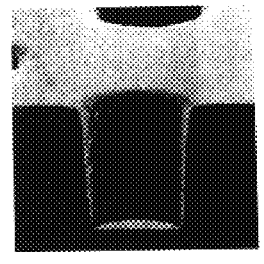
Figure 9C:
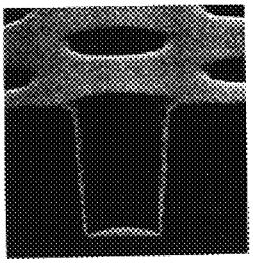

Column 4,
Line 16, "FIG. 6 illustrates" should read -- FIGS. 6A, and 6B illustrate --;
Line 21, "illustrate" should read -- illustrates --;
Line 28, "FIG. 9 shows" should read -- FIGS. 9A to 9C show --;
Line 32, " FIG 10 shows" should read -- FIGS 10A to 10C show --.

UNITED STATES PATENT AND TRADEMARK OFFICE
CERTIFICATE OF CORRECTION

PATENT NO. : 6,107,007
DATED : August 22, 2000
INVENTOR(S) : Tadahiro Ohmi et al.

It is certified that error appears in the above-identified patent and that said Letters Patent is hereby corrected as shown below:

Column 5,
Line 5, "FIG. 24B3" should read -- FIG. 24B14 --;
Line 8, "24A4)" should read -- 24A18) --;
Line 9, "24B3)." should read -- 24B14). --;
Line 26, "and 31B" should read -- to 31B2 --;
Line 32, "FIG. 33 shows" should read -- FIGS. 33A to 33C show --.

Column 8,
Line 53, "denotes" should read -- denote --.

Column 9,
Line 28, "various shape" should read -- various shapes --;
Line 32, "portion" should read -- portions --;
Line 51, "shape" should read -- shapes --;
Line 54, "1 disadvantages" should read -- 1, disadvantages --.

Column 10,
Line 28, "affect" should read -- affects --.

Column 11,
Line 13, "Further" should read -- Further --;
Line 44, "FIG. 6" should read -- FIG. 6B --;
Line 50, "FIG. 6" should read -- FIG. 6A --;
Line 64, "filed" should read -- field --;
Line 65, "aperture" should read -- an aperture --.

Column 12,
Line 34, "corresponds" should read -- correspond --.

Column 13,
Line 57, "sized" should read -- sizes --.

Column 14,
Line 48, "In" should be deleted.

Column 15,
Line 46, "opening" should read -- openings --.

UNITED STATES PATENT AND TRADEMARK OFFICE
CERTIFICATE OF CORRECTION

PATENT NO. : 6,107,007
DATED : August 22, 2000
INVENTOR(S) : Tadahiro Ohmi et al.

It is certified that error appears in the above-identified patent and that said Letters Patent is hereby corrected as shown below:

Column 16,
Line 12, "corresponds" should read -- correspond --;
Line 26, "lenses,the" should read -- lenses, the --;
Line 46, "appears" should read -- appear --.

Column 17,
Line 21, "ont" should read -- onto --;
Line 28, "effective" should read -- an effective --.

Column 18,
Line 51, "move" should read -- moves -- and "are" should read -- is --;
Lines 53 and 54, "are" should read -- is --.

Column 19,
Line 19, "is" should read -- are --;
Line 43, "output" should read -- outputs --.

Column 20,
Line 12, "an" should read -- a --;
Line 58, "have" should read -- has --;
Line 62, "is" should read -- are --;
Line 64, "248.4 nm" should read -- 248.4 nm. --.

Column 21,
Line 29, "the each" should read -- each --.

Column 22,
Line 3, "pumps" should read -- lamps -- and "a" (second occurrence) should read -- an --;
Line 24, "the each" should read -- each --;
Line 49, "rinsed" should read -- been rinsed --;
Line 67, "surface of the" (second occurrence) should be deleted.

Column 23,
Line 15, "docs" should read -- do --;
Line 44, should read: "FIGS. 24A1-24A18 and 24B1-24B14. In FIGS. 24A1-24A18".

UNITED STATES PATENT AND TRADEMARK OFFICE
CERTIFICATE OF CORRECTION

PATENT NO. : 6,107,007
DATED : August 22, 2000
INVENTOR(S) : Tadahiro Ohmi et al.

It is certified that error appears in the above-identified patent and that said Letters Patent is hereby corrected as shown below:

Column 24,
Line 1, "24B1-24B3," should read -- 24B1-24B14, --;
Line 4, "FIGS. 24A1-24A4 and 24B1-24B3," should read -- FIGS. 24A1-24A18 and 24B1-24B14 --;
Line 15, "weight;" should read -- weight: --;
Lines 42-43, "feasible practically" should read -- is practically feasible --;
Table 1, "Epan 619," should read -- Epan 610, --.

Column 26,
Line 7, "lithographic" should read -- lithography --.

Signed and Sealed this

Twenty seventh Day of November, 2001

Attest:

NICHOLAS P. GODICI
*Attesting Officer*     *Acting Director of the United States Patent and Trademark Office*